(12) United States Patent
Aritome

(10) Patent No.: US 9,484,099 B2
(45) Date of Patent: *Nov. 1, 2016

(54) THREE DIMENSIONAL SEMICONDUCTOR MEMORY DEVICE WITH LINE SHARING SCHEME

(71) Applicant: SK hynix Inc., Gyeonggi-do (KR)

(72) Inventor: Seiichi Aritome, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 14/843,616

(22) Filed: Sep. 2, 2015

(65) Prior Publication Data

US 2015/0380089 A1    Dec. 31, 2015

Related U.S. Application Data

(62) Division of application No. 14/057,867, filed on Oct. 18, 2013, now Pat. No. 9,159,424.

(30) Foreign Application Priority Data

Jun. 28, 2013    (KR) .................. 10-2013-0075221

(51) Int. Cl.
| | | |
|---|---|---|
| G11C 16/04 | (2006.01) | |
| G11C 16/26 | (2006.01) | |
| G11C 16/08 | (2006.01) | |
| G11C 16/10 | (2006.01) | |
| G11C 16/34 | (2006.01) | |
| G11C 16/24 | (2006.01) | |
| G11C 16/30 | (2006.01) | |
| H01L 27/115 | (2006.01) | |

(52) U.S. Cl.
CPC ....... *G11C 16/0483* (2013.01); *G11C 16/0408* (2013.01); *G11C 16/08* (2013.01); *G11C 16/10* (2013.01); *G11C 16/24* (2013.01); *G11C 16/26* (2013.01); *G11C 16/30* (2013.01); *G11C 16/3404* (2013.01); *G11C 16/3427* (2013.01); *H01L 27/11556* (2013.01); *H01L 27/11582* (2013.01)

(58) Field of Classification Search
CPC .................................. G11C 16/0483
USPC .................................. 365/185.11
See application file for complete search history.

(56) References Cited

U.S. PATENT DOCUMENTS

| | | | |
|---|---|---|---|
| 9,196,317 B2 * | 11/2015 | Aritome ............... | G11C 5/063 |
| 2009/0003047 A1 * | 1/2009 | Toda .................... | G11C 13/00 365/163 |
| 2010/0020617 A1 * | 1/2010 | Oh ...................... | G11C 16/0483 365/185.23 |
| 2010/0188885 A1 * | 7/2010 | Toda ................... | G11C 11/5685 365/148 |

* cited by examiner

*Primary Examiner* — Hoai V Ho
(74) *Attorney, Agent, or Firm* — IP & T Group LLP

(57) ABSTRACT

A semiconductor memory device includes a memory array including memory blocks stacked in a plurality of layers over a substrate and an operation circuit suitable for performing a read operation and a program loop to memory cells included in the memory blocks, wherein word lines of the memory blocks are coupled to each other and a pair of the memory blocks are arranged vertically adjacent to each other and share bit lines.

11 Claims, 32 Drawing Sheets

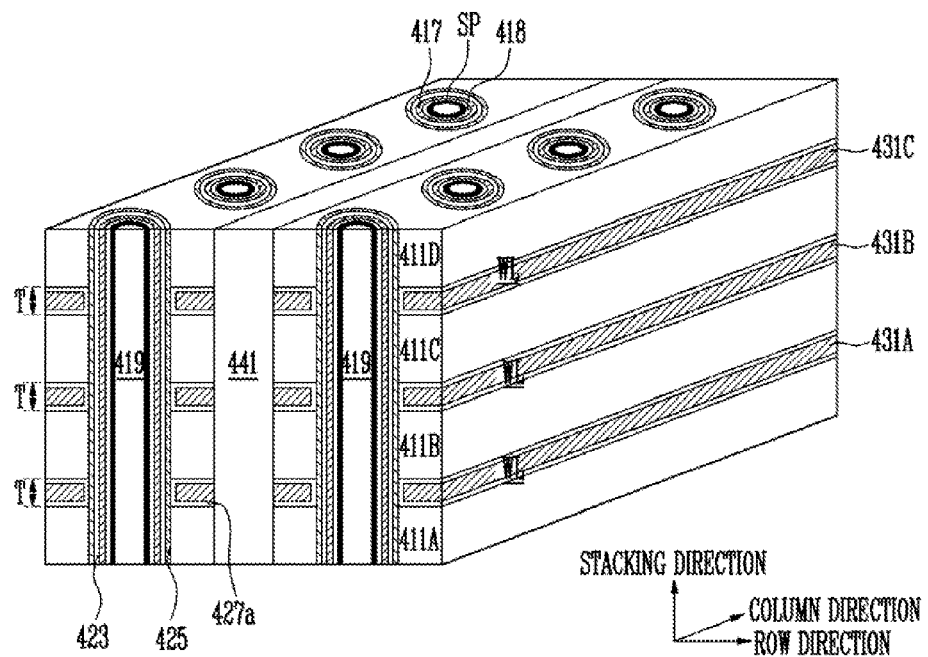

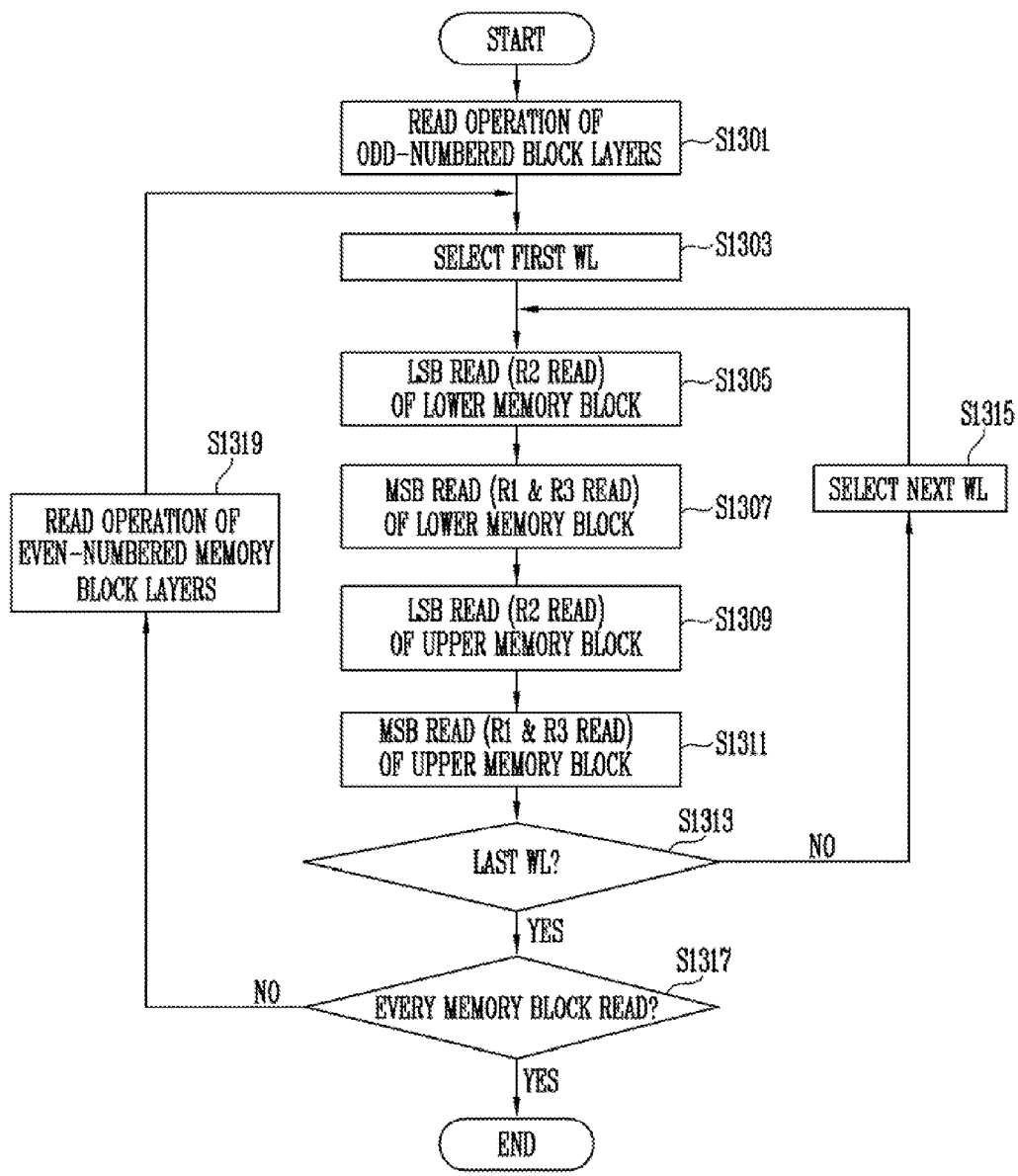

| | | LSB | MSB |
|---|---|---|---|
| 4th string (ST3) | WL0 | 129 | 131 |
| | WL1 | 133 | 135 |
| | WL2 | 137 | 139 |
| | ... | | |
| | WL29 | 245 | 247 |
| | WL30 | 249 | 251 |
| | WL31 | 253 | 255 |
| 3rd string (ST2) | WL31 | 125 | 127 |
| | WL30 | 121 | 123 |
| | WL29 | 117 | 119 |
| | ... | ... | ... |
| | WL2 | 9 | 11 |
| | WL1 | 5 | 7 |
| | WL0 | 1 | 3 |
| 2nd string (ST1) | WL0 | 128 | 130 |
| | WL1 | 132 | 134 |
| | WL2 | 136 | 138 |
| | ... | | |
| | WL29 | 244 | 246 |
| | WL30 | 248 | 250 |
| | WL31 | 252 | 254 |
| 1st string (ST0) | WL31 | 124 | 126 |
| | WL30 | 120 | 122 |
| | WL29 | 116 | 118 |
| | ... | ... | ... |
| | WL2 | 8 | 10 |
| | WL1 | 4 | 6 |
| | WL0 | 0 | 2 |

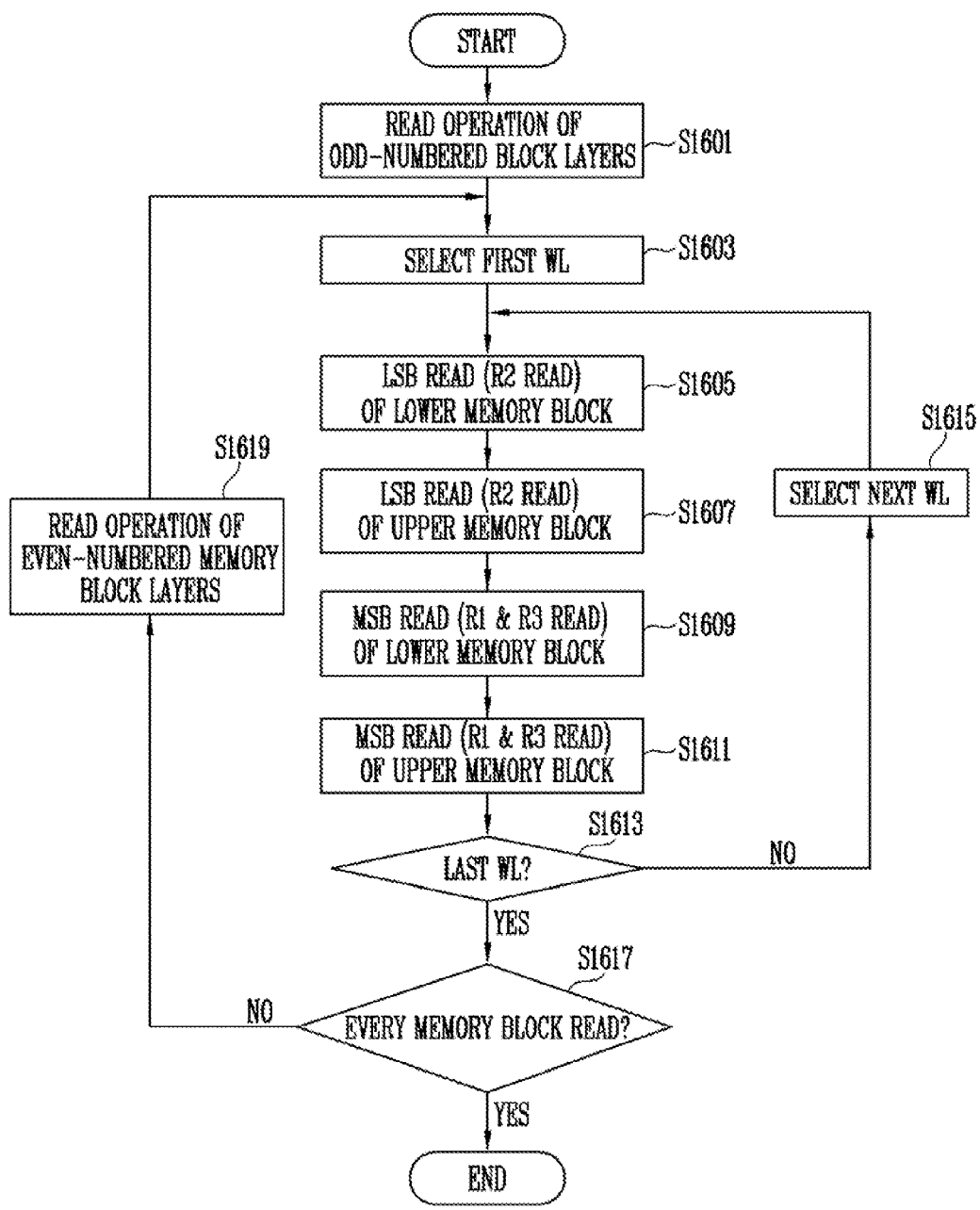

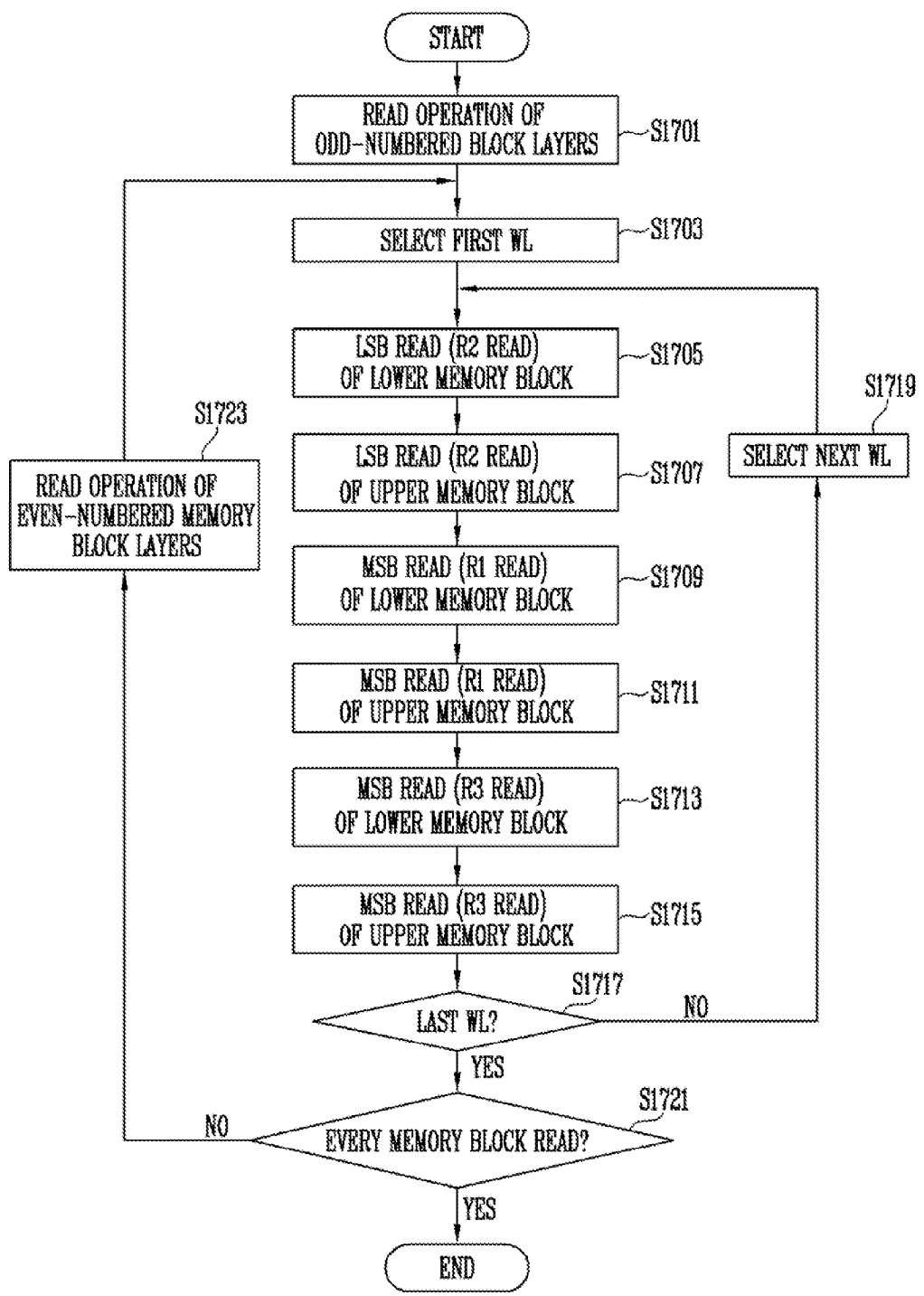

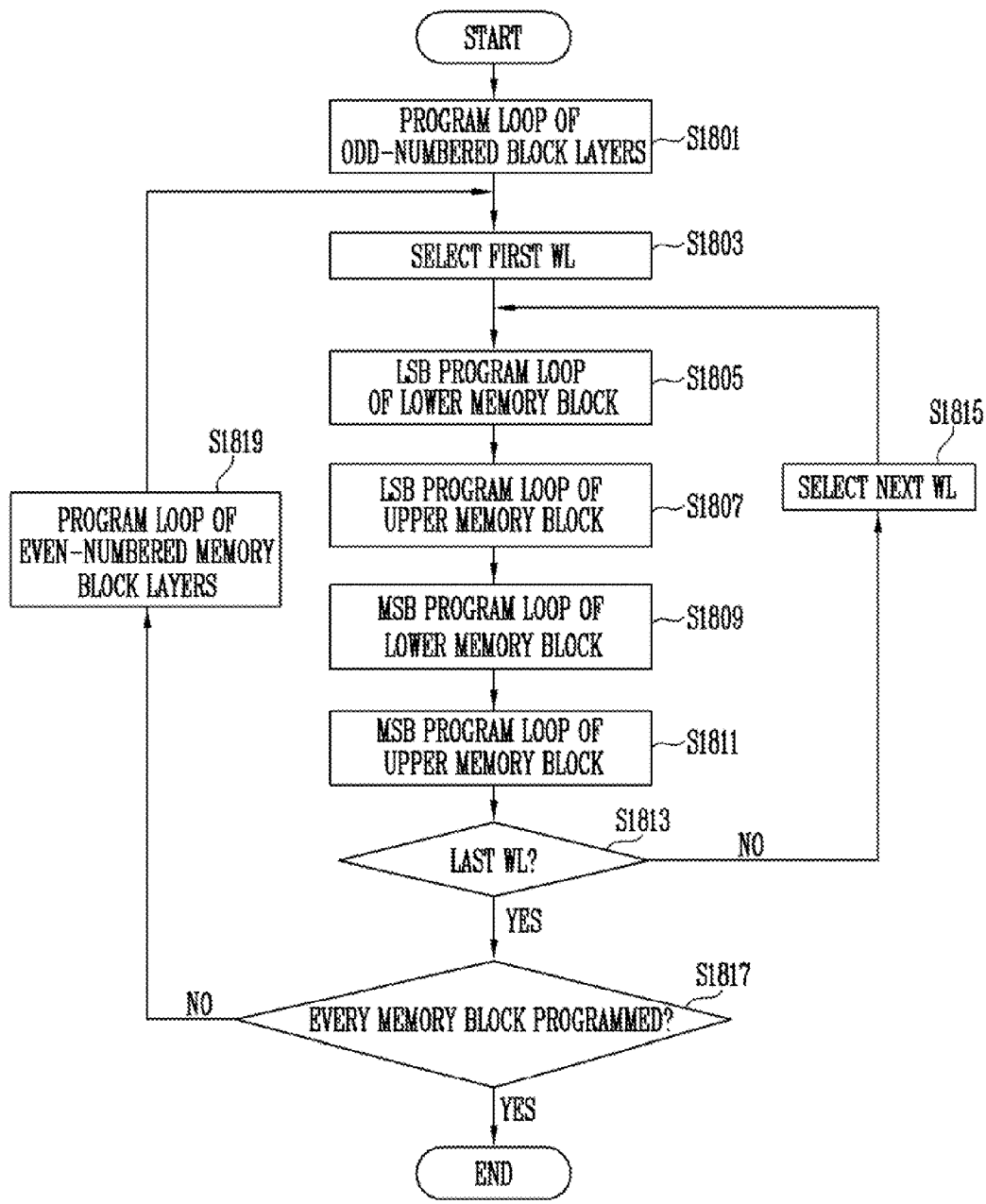

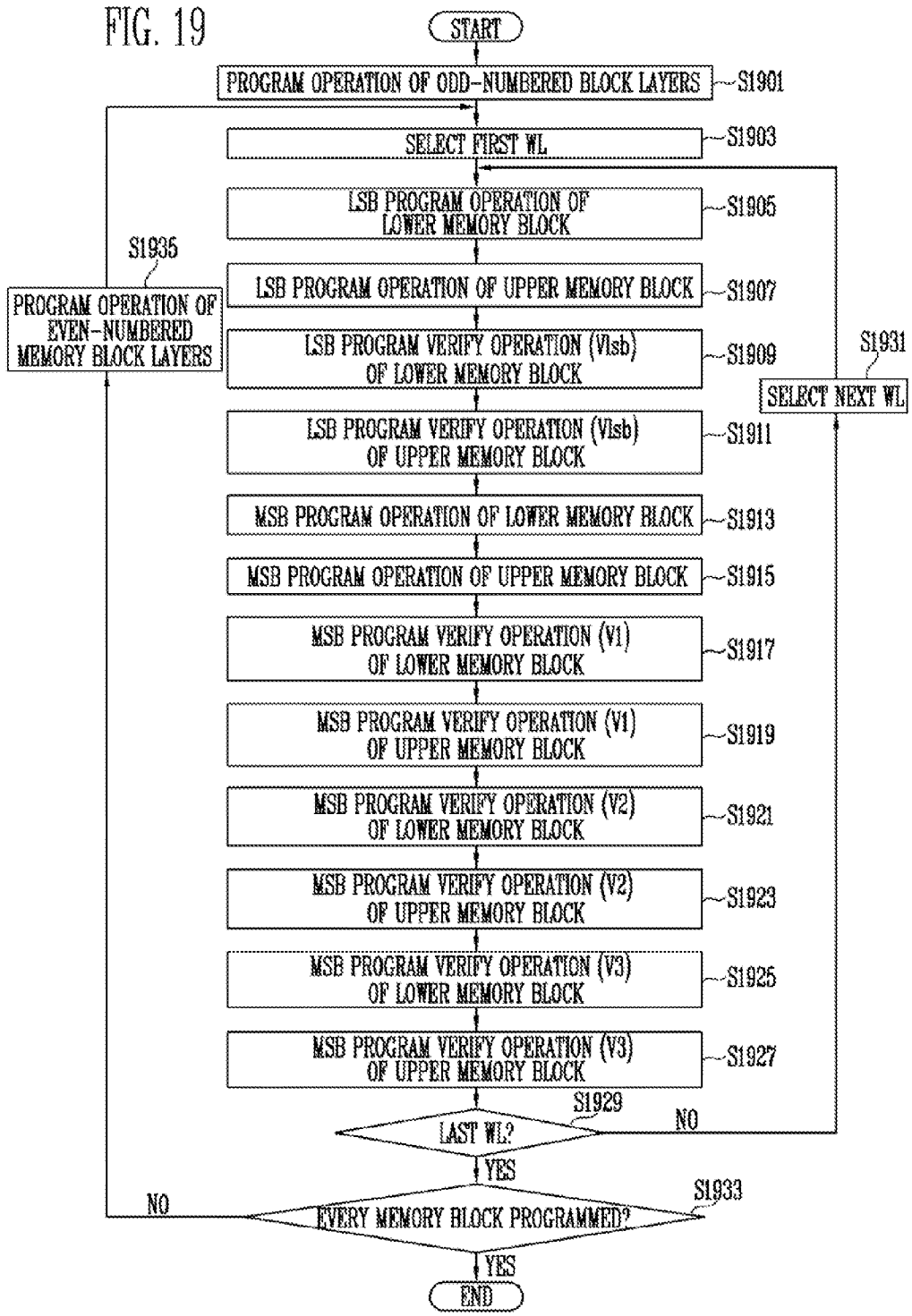

THREE DIMENSIONAL SEMICONDUCTOR MEMORY DEVICE WITH LINE SHARING SCHEME

CROSS-REFERENCE TO RELATED APPLICATION

This application is a division of U.S. patent application Ser. No. 14/057,867 filed on Oct. 18, 2013, which claims priority of Korean patent application number 10-2013-0075221 filed on Jun. 28, 2013, in the Korean Intellectual Property Office. The entire disclosure of the foregoing application is incorporated by reference herein.

BACKGROUND

1. Technical Field

Various embodiments relate generally to a semiconductor memory device and, more particularly, to a semiconductor memory device including memory cells stacked in a vertical direction to a substrate.

2. Related Art

One possible way to increase storage capacity is to provide a larger number of memory cells within a predetermined area. The number of memory cells may be increased by reducing memory cell size, but there are limitations in memory cell size reduction. A method for increasing the number of memory cells is to provide a three-dimensional (3D) structured memory block or memory string where memory cells are stacked in a direction vertical to a semiconductor substrate. The 3D structured memory string may include a vertical channel that is formed of silicon. The vertical channel may be formed between a bit line and a common source line.

Recently, a method of increasing density of three-dimensional memory blocks within a predetermined area has been in demand, and a method of preventing deterioration of electrical characteristics caused thereby has also been in demand.

BRIEF SUMMARY

Various embodiments relate to a semiconductor memory device that may form a large number of memory cells within a predetermined area and improving electrical characteristics.

A semiconductor memory device according to an embodiment of the present invention may include a memory array including memory blocks stacked in a plurality of layers over a substrate and an operation circuit suitable for performing a read operation and a program loop to memory cells included in the memory blocks, wherein word lines of the memory blocks are coupled to each other and a pair of the memory blocks are arranged vertically adjacent to each other and share bit lines.

A semiconductor memory device according to another embodiment of the present invention may include a memory array including a first to a fourth memory blocks sequentially stacked over a substrate, a first circuit suitable for performing a read operation and a program loop to memory cells included in the first or the second memory block and a second circuit suitable for performing the read operation and the program loop to memory cells included in the third or the fourth memory block, wherein the first circuit is coupled to the first and the second memory blocks through lower bit lines, and the second circuit is coupled to the third and the fourth memory blocks through upper bit lines.

BRIEF DESCRIPTION OF THE DRAWINGS

FIGS. 4A to 4C are three-dimensional views illustrating a structure of a memory cell of the memory string shown in FIG. 2;

FIG. 13 is a flowchart illustrating a method of operating a semiconductor memory device according to an embodiment of the present invention;

FIGS. 16 to 19 are flowcharts illustrating a method of operating a semiconductor memory device according to an embodiment of the present invention;

DETAILED DESCRIPTION

Figure 1:
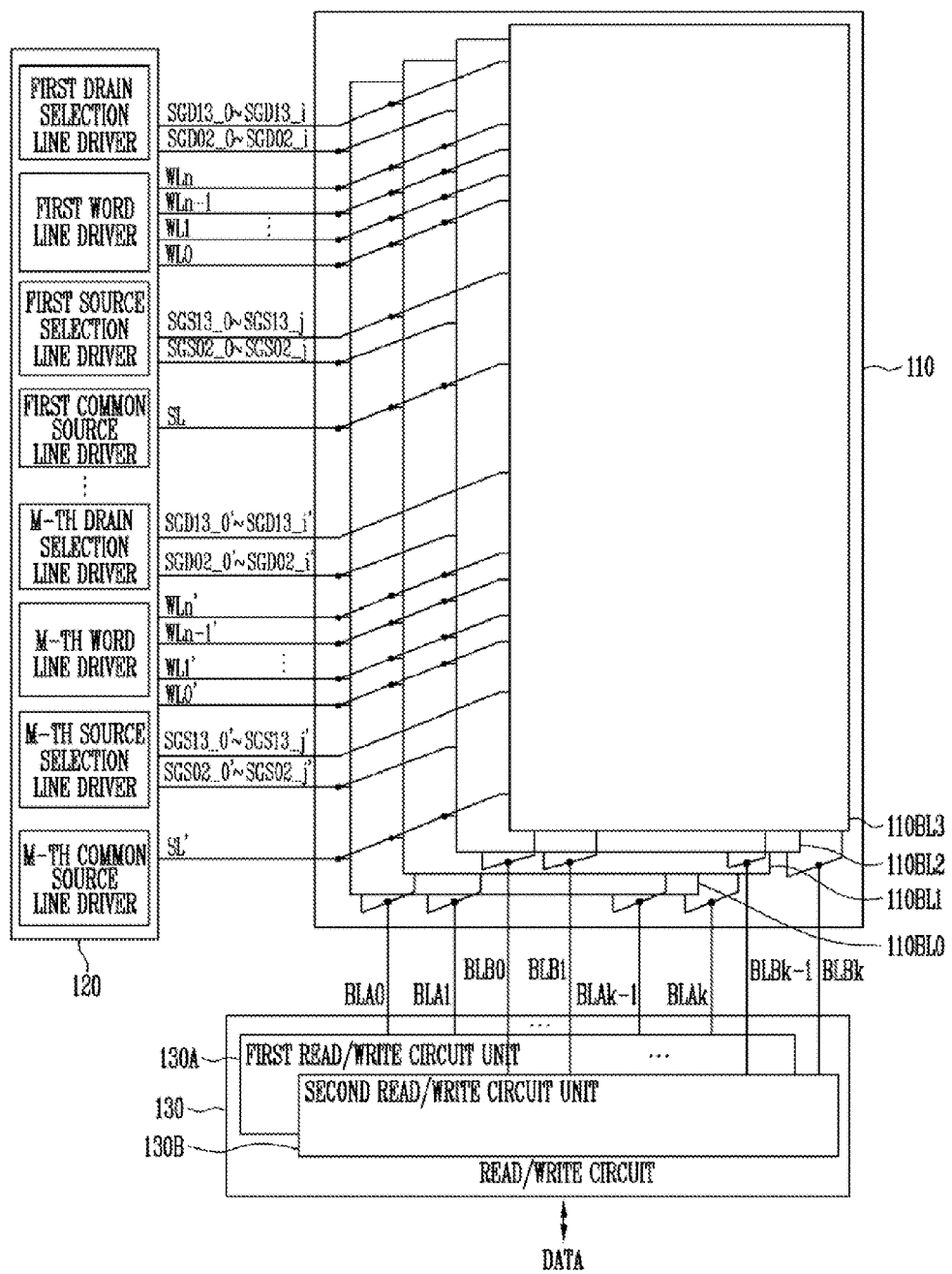
FIG. 1 is a block diagram illustrating a semiconductor memory device according to an embodiment of the present invention.

Hereinafter, various embodiments will be described in detail with reference to the accompanying drawings. The figures are provided to allow those having ordinary skill in the art to understand the scope of the embodiments of the disclosure. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention.

The drawings are not necessarily to scale and in some instances, proportions may have been exaggerated in order to clearly illustrate features of the embodiments.

Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added.

FIG. 1 is a block diagram illustrating a semiconductor memory device according to an embodiment of the present invention.

Referring to FIG. 1, a semiconductor memory device may include a memory array 110, operation circuits 120 and 130. The operation circuits may include a voltage supply circuit 120 and a read/write circuit group 130.

The memory array 110 may include a plurality of memory block layers 110BL0 to 110BL3 that are stacked over a substrate. Each of the memory block layers 110BL0 to 110BL3 may include memory blocks arranged in a direction horizontal to the substrate. These memory blocks may be arranged in a predetermined direction, for example, a bit line direction. Each of the memory blocks may include memory strings coupled between bit lines and common source lines. The bit lines and the common source lines may extend in a direction crossing each other. The structure of the memory string is described below in detail.

Figure 2:
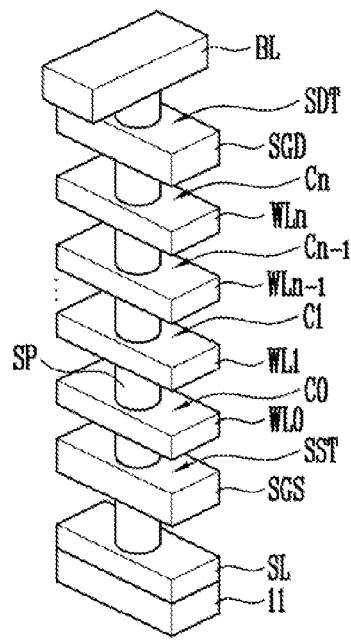
FIG. 2 is a three-dimensional view illustrating a memory string included in a memory array shown in FIG. 1.

FIG. 2 is a three-dimensional view illustrating one of the memory strings included in the memory array shown in FIG. 1.

Figure 3:
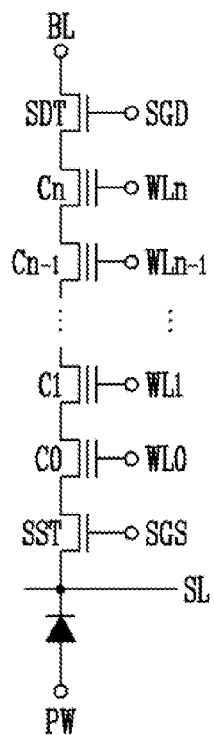
FIG. 3 is a circuit diagram illustrating a memory string included in the memory array shown in FIG. 1.

FIG. 3 is a circuit diagram illustrating one of the memory strings included in the memory array shown in FIG. 1.

Referring to FIGS. 2 and 3, a common source line SL may be formed on a semiconductor substrate in which a P well PW is formed. A vertical channel layer SP may be formed on the common source line SL. A bit line BL may be coupled to a top portion of the vertical channel layer SP. The vertical channel layer SP may include polysilicon. A plurality of conductive layers SGS, WL0 to WLn and SGD may surround the vertical channel layer SP at different heights. A multilayer (not illustrated) including a charge storage layer may be formed on a surface of the vertical channel layer SP. The multilayer may be located between the vertical channel layer SP and the conductive layers SGS, WL0 to WLn and SGD.

The lowermost conductive layer may be a source selection line or first selection line SGS, and the uppermost conductive layer may be a drain selection line or second selection line SGD. The other conductive layers, interposed between the source and drain selection lines SGS and SGD, may be word lines WL0 to WLn. Moreover, the conductive layers SGS, WL0 to WLn and SGD may be stacked over the semiconductor substrate and the vertical channel layer SP, passing through the conductive layers SGS, WL0 to WLn and SGD, may be vertically coupled between the bit line BL and the common source line SL formed on the semiconductor substrate.

A drain selection transistor or second selection transistor SDT may be formed at a position where the uppermost conductive layer SGD surrounds the vertical channel layer SP. A source selection transistor or first selection transistor SST may be formed at a position where the lowermost conductive layer SGS surrounds the vertical channel layer SP. Memory cells C0 to Cn may be formed at positions where the intermediate conductive layers WL0 to WLn surround the vertical channel layer SP, respectively.

The memory string of the above-described structure may include the source selection transistor SST, the memory cells C0 to Cn and the drain selection transistor SDT that are coupled in the direction vertical to the substrate between the common source line SL and the bit line BL. The source selection transistor SST may electrically couple the memory cells C0 to Cn to the common source line SL in response to a first selection signal applied to the first selection line SGS. The drain selection transistor SDT may electrically couple the memory cells C0 to Cn to the bit line BL in response to a second selection signal applied to the second selection line SGD.

Figure 4A:
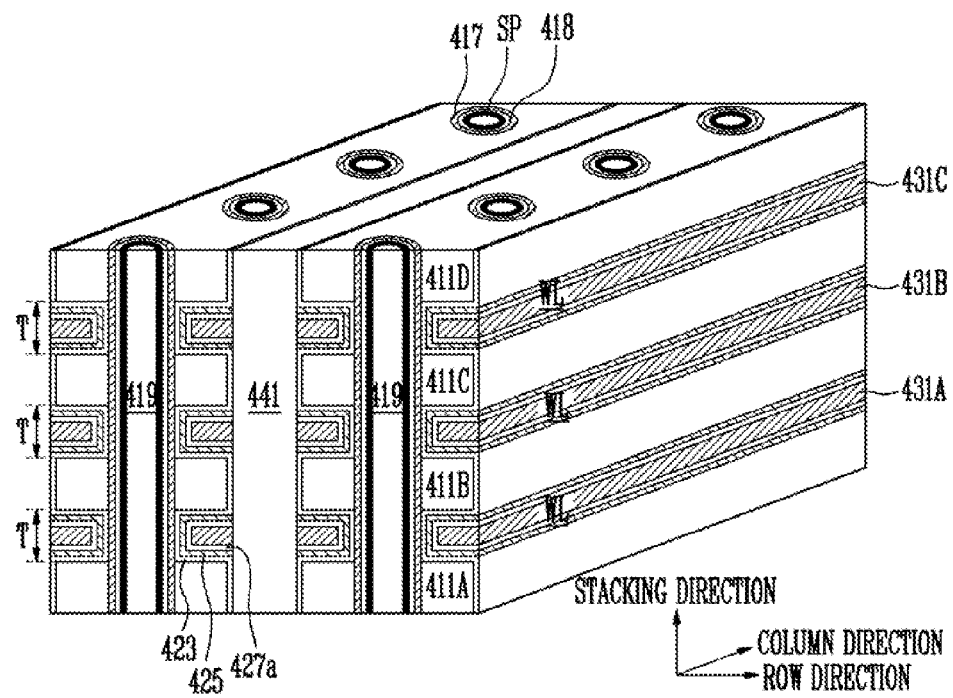
Figure 4B:
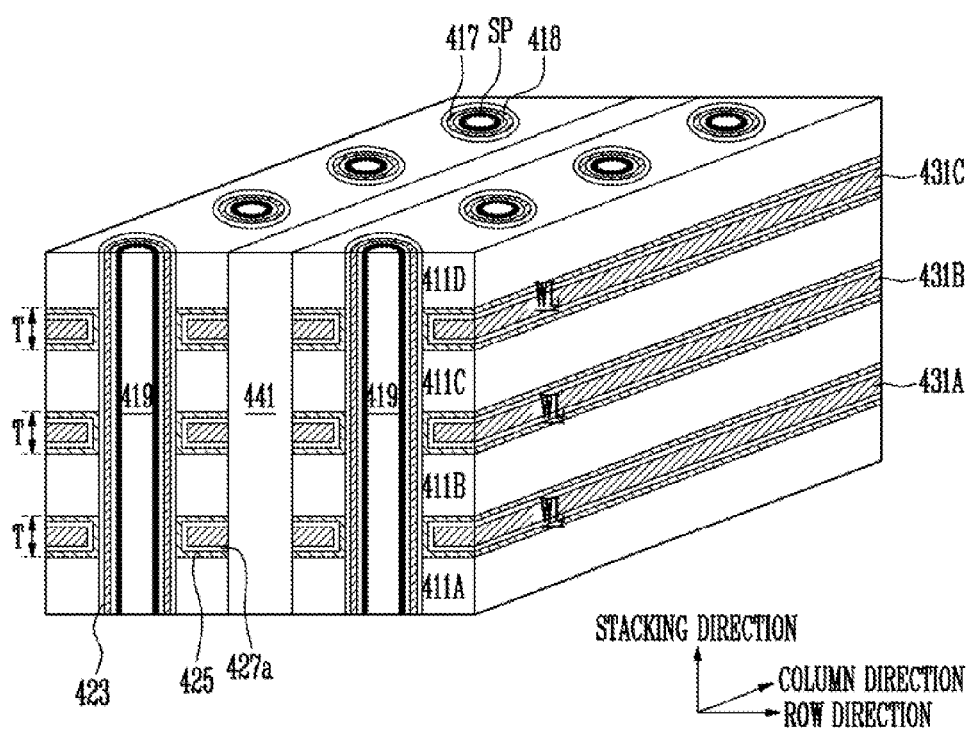

FIGS. 4A to 4C are three-dimensional views illustrating the structure of one of the memory cells of the memory string shown in FIG. 2.

Referring to FIGS. 4A to 4C, a three-dimensional memory device according to embodiments of the present invention may include vertical channel layers SP. The vertical channel layers SP may protrude from above the substrate (not illustrated) and form a matrix including a plurality of rows and a plurality of columns. Each of the vertical channel layers SP may be a tubular shape having a central portion filled with an insulating layer 419 or a pillar shape having a surface and a central portion filled with a semiconductor material layer.

Each of the vertical channel layers SP may be surrounded by a plurality of interlayer insulating layers 411A to 411D and a plurality of conductive layers 431A to 431C that are stacked alternately with each other. The plurality of interlayer insulating layers 411A to 411D and the plurality of conductive layers 431A to 431C may be formed between the vertical channel layers SP adjacent to each other in a column direction and may be separated by an insulating layer 441. The insulating layer 441 may pass through the interlayer insulating layer 411A to 411D and extend in the column direction.

The conductive layers 431A to 431C may be formed in trenches T between the interlayer insulating layer 411A to 411D that are adjacent to each other and may be separated by the trenches T. The trenches T may refer to spaces in which word lines WL are formed.

The conductive layers 431A to 431C may be surrounded by barrier metal patterns 427a. Each of the barrier metal patterns 427a may be formed in each of the trenches T and separated by each of the trenches T.

A charge blocking layer 423 may be interposed between the vertical channel layers SP and the barrier metal patterns 427a. A diffusion barrier layer 425 may be interposed between the barrier metal patterns 427a and the charge blocking layer 423. In addition, a charge storage layer 417 may be interposed between the charge blocking layer 423 and the vertical channel layer SP. A tunnel insulating layer 418 may be interposed between the charge storage layer 417 and the vertical channel layer SP.

The charge storage layer 417 and the tunnel insulating layer 418 may surround an outer wall of the vertical channel layer SP.

As illustrated in FIG. 4A, the charge blocking layer 423 may be formed along surfaces of the trenches T and surround the barrier metal patterns 427a. Alternately, as illustrated in FIGS. 4B and 4C, the charge blocking layer 423 may surround the outer wall of the vertical channel layer SP.

As illustrated in FIGS. 4A and 4B, the diffusion barrier layer 425 may be formed along the surfaces of the trenches T and surround the barrier metal patterns 427a. Alternatively, when the diffusion barrier layer 425 is an insulating layer, as illustrated in FIG. 4C, the diffusion barrier layer 425 may surround the outer wall of the vertical channel layer SP.

The conductive layers 431A to 431C and the barrier metal patterns 427a, formed in the trenches T, may function as the word lines WL. Memory cell transistors may be defined at intersections between the word lines WL and the vertical channel layer SP. The memory cell transistors of the above-described structure according to an embodiment of the present invention may be stacked along the vertical channel layer SP and arranged in three dimensions.

Each of the conductive layers 431A to 431C may include a polysilicon layer or a material layer having a lower resistance and a higher work function than the polysilicon layer. For example, each of the conductive layers 431A to 431C may include tungsten. When each of the conductive layers 431A to 431C includes a material layer having a high work function, back tunneling of charges toward the charge storage layer through the charge blocking layer 423 may be reduced, which may improve retention characteristics of memory cells.

The barrier metal pattern 427a may include a material for preventing reactions between the conductive layers 431A to 431C of a high work function and the charge blocking layer 423. In addition, the barrier metal pattern 427a may include a material layer having a high work function in order to reduce a back tunneling phenomenon.

Figure 5:
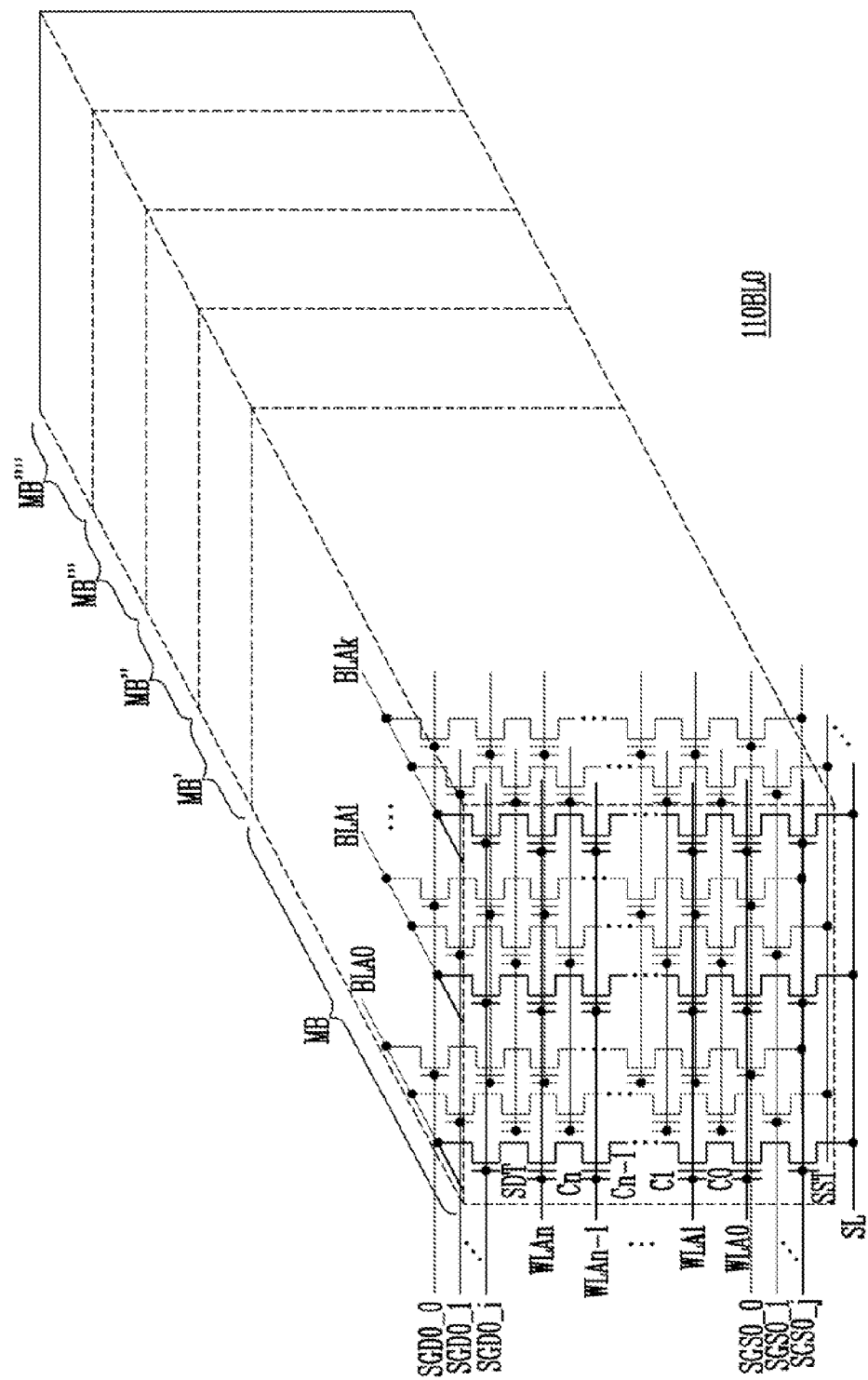
FIG. 5 is a circuit diagram illustrating a memory block layer included in the memory array shown in FIG. 1.

FIG. 5 is a circuit diagram illustrating one of the memory block layers included in the memory array shown in FIG. 1.

Referring to FIG. 5, the memory block layer 110BL0 may include a plurality of memory blocks that are arranged in the direction horizontal to the substrate. In FIG. 5, only five memory blocks are shown for illustrative purposes. Each of the memory blocks, for example, a memory block MB may include memory strings coupled between bit lines BLA0 to BLAk and the common source lines SL. In FIG. 5, three bit lines are shown for illustrative purposes. In the memory block layer 110BL0, the memory blocks may share the bit lines BLA0 to BLAk, and the common source lines SL of the memory blocks may be separated from each other. The bit lines BLA0 to BLAk may extend in a direction in parallel with the horizontal direction in which the memory blocks MB are arranged.

In each of the memory blocks MB, the plurality of memory strings may be coupled to each of the bit lines BLA0 to BLAk, and the plurality of memory strings may be coupled to each of the common source lines SL. Each of the memory strings may include the first selection transistor or source selection transistor SST coupled to the common source line SL, the second selection transistor or drain selection transistor SDT coupled to the bit line BLA0 and the memory cells C0 to Cn vertically coupled in series between the first and second selection transistors SST and SDT.

The memory cells C0 to Cn included in each of the memory strings in the memory block MB may share word lines WLA0 to WLAn. That is, the word lines WLA0 to WLAn of the memory cells C0 to Cn included in each of the memory strings may be coupled to each other. Moreover, in the memory block MB, word lines of memory cells, which are formed in the same layer and adjacent to each other in the horizontal direction, may be coupled to each other.

In the memory block MB, the drain selection transistors SDT of the memory strings, which are coupled to the bit lines BLA0 to BLAk, respectively, may share the same drain selection line, for example, SGD0_0. That is, gates of the drain selection transistors SDT of the memory strings coupled to the bit lines BLA0 to BLAk may be coupled to each other. The drain selection transistors SDT of the memory strings, which are coupled to the same bit line, for example, BLA0, in the memory block MB may have drain selection lines SGD0_0 to SGD0_i, respectively. That is, the drain selection lines SGD0_0 to SGD0_i of the drain selection transistors SDT of the memory strings, which are coupled to the same bit line BLA0, may be separated from each other. Thus, the drain selection transistors SDT coupled to the same bit line BLA0 may be independently operated by different operating voltages. The drain selection lines SGD0_0 to SGD0_i may extend in a direction crossing the bit lines BLA0 to BLAk.

The source selection transistors SST of the memory strings coupled to the bit lines BLA0 to BLAk in the memory block MB may share a source selection line, for example, SGS0_0. That is, gates of the source selection transistors SST of the memory strings, which are coupled to the bit lines BLA0 to BLAk may be coupled to each other. However, the source selection transistors SST of the memory strings, which are coupled to the same bit line, for example, BLA0, in the memory block MB may have source selection lines SGS0_0 to SGS0_i, respectively. That is, the source selection lines SGS0_0 to SGS0_i of the source selection transistors SST of the memory strings, which are coupled to the same bit line BLA0, may be separated from each other. Thus, the source selection transistors SST coupled to the same bit line BLA0 may be independently operated by different operating voltages. The source selection lines SGS0_0 to SGS0_i may extend in a direction crossing the bit lines BLA0 to BLAk. However, according to memory cell design, all the source selection lines SGS0_0 to SGS0_i may be coupled to each other in the memory block MB. In addition, operating voltages being applied to the memory blocks during a read operation, a program operation and an erase operation may vary according to a coupling state of the source selection lines SGS0_0 to SGS0_i and a decoupled state of the common source lines SL in the memory block MB.

The source selection lines SGS0_0 to SGS0_i, the word lines WLA0 to WLAn, the drain selection lines SGD0_0 to SGD0_i and the common source lines SL of the memory block MB in the memory block layer 110BL0 may be separated from source selection lines (not illustrated), word lines (not illustrated), drain selection lines (not illustrated) and common source lines (not illustrated) of the other memory blocks. That is, in the memory block layer 110BL0, the source selection lines SGS0_0 to SGS0_*i*, the word lines WLA0 to WLAn, the drain selection lines SGD0_0 to SGD0_*i* and the common source lines SL of each of the memory blocks MB may be separated from those of the other memory blocks.

Figure 6:
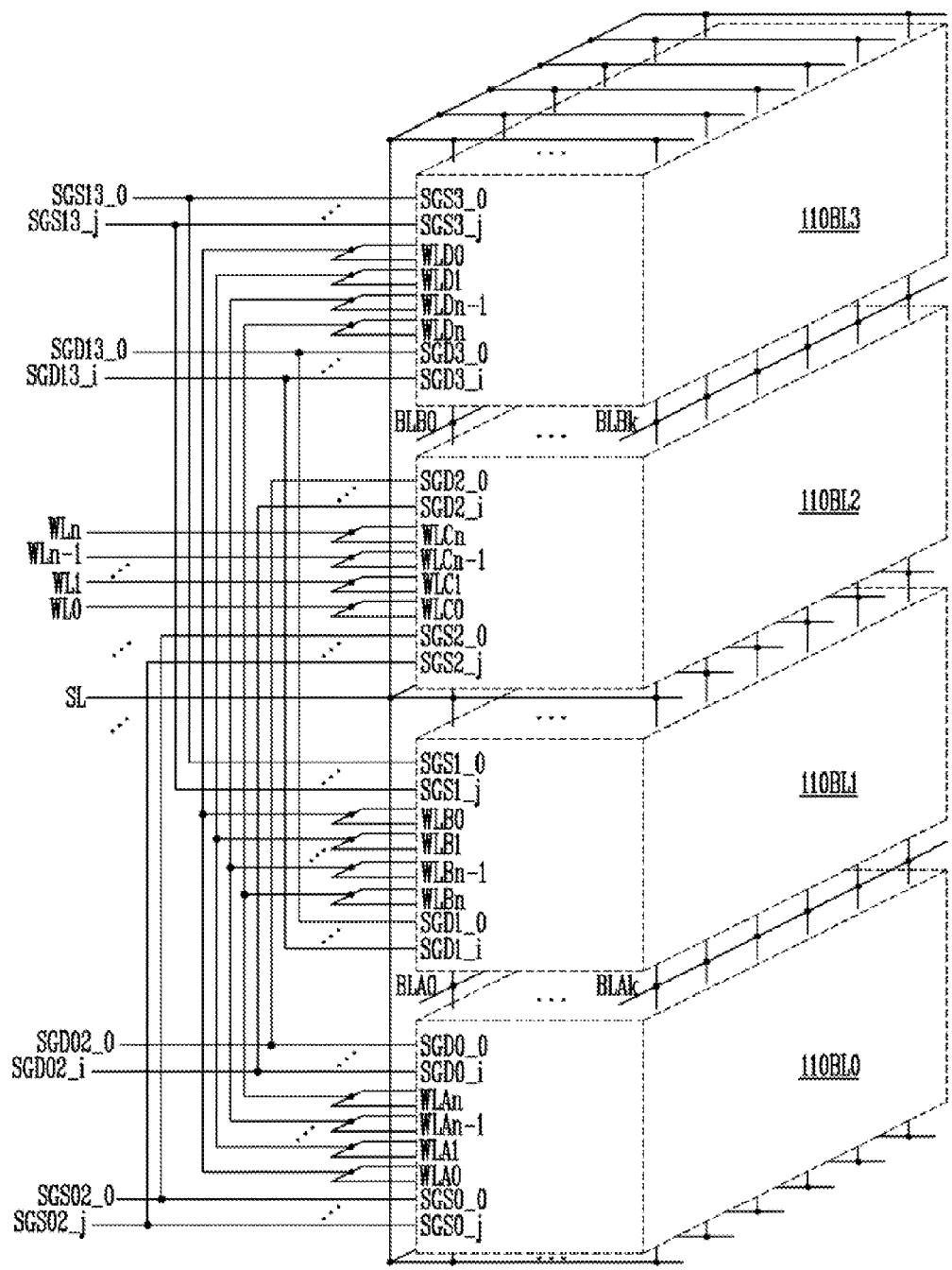
FIG. 6 is a block diagram illustrating a memory array shown in FIG. 1.

FIG. 6 is a block diagram illustrating the memory array shown in FIG. 1.

Figure 7:
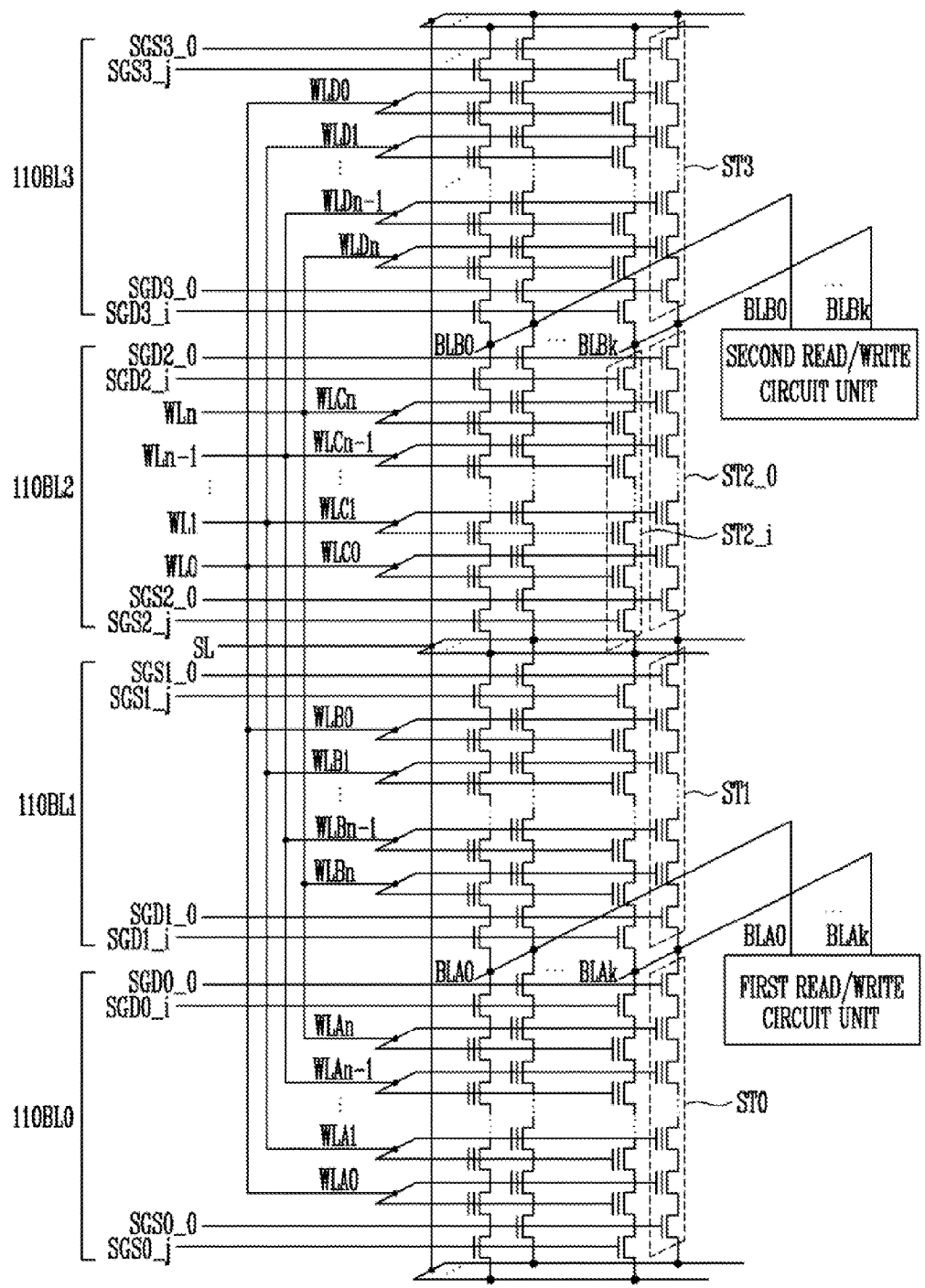
FIG. 7 is a circuit diagram illustrating a memory array shown in FIG. 1.

FIG. 7 is a circuit diagram illustrating the memory array of FIG. 1.

Referring to FIGS. 6 and 7, at least two of the memory block layers, which is described above with reference to FIG. 5, may be stacked upon one another. In a preferred embodiment, the memory block layers 110BL0 to 110BL3 may be stacked in four or more layers. The memory blocks or memory strings included in the odd-numbered memory block layer 110BL0 and 110BL2 and the memory blocks or memory strings included in the even-numbered memory block layer 110BL1 or 110BL3 may share the bit lines BLA0 to BLAk and BLB0 to BLBk and the common source lines, respectively. For example, the lowermost memory block layer 110BL0 and the memory block layer 110BL1 located on the lowermost memory block layer 110BL0 may share the first lower bit lines BLA0 to BLAk and the uppermost memory block layer 110BL3 and the memory block layer 110BL2 located under the uppermost memory block layer 110BL3 may share the first upper bit lines BLB0 to BLBk.

More specifically, for example, the odd-numbered memory block layer 110BL2 may share the bit lines BLB0 to BLBk with the even-numbered memory block layer 110BL3 and may share the common source lines SL with the even-numbered memory block layer 110BL1. In addition, for example, the even-numbered memory block layer 110BL1 may share the common source lines SL with the odd-numbered memory block layer 110BL2 stacked thereon and may share the bit lines BLA0 to BLAk with the odd-numbered memory block layer 110BL0 stacked thereunder. The bit lines BLA0 to BLAk and the bit lines BLB0 to BLBk may be formed in different layers, and the common source lines SL may be formed in different layers.

As described above, in order for the memory block layers 110BL0 to 110BL3 to share the bit lines BLA0 to BLAk and BLB0 to BLBk and the common source lines SL, the memory block layers may be stacked so that the memory blocks, which are included in the odd-numbered memory block layers 110BL0 and 110BL2, and the memory blocks, which are included in the even-numbered memory block layers 110BL1 and 110BL3, may have vertical symmetry.

The memory block layers 110BL0 to 110BL3 may share common word lines WL0 to WLn. That is, word lines WLA0 to WLAn, WLB0 to WLBn, WLC0 to WLCn and WLD0 to WLDn of the memory block layers 110BL0 to 110BL3 may be vertically coupled with each other. More specifically, the first word lines WLA0 to WLAn, WLB0 to WLBn, WLC0 to WLCn, and WLD0 to WLDn of the first memory blocks included in the memory block layers 110BL0 to 110BL3 may be vertically coupled to each other. In addition, word lines of the last memory blocks included in the memory block layers 110BL0 to 110BL3 may be vertically coupled to each other. That is, word lines of different memory blocks may be coupled to each other in the vertical direction, but not in the horizontal direction.

The memory block layers 110BL0 to 110BL3 may share the common source lines SL. That is, the common source lines SL of the memory block layers 110BL0 to 110BL3 may be vertically coupled to each other. Similar to the word lines WL0 to WLn, common source lines of different memory blocks may be coupled to each other in the vertical direction, but not in the horizontal direction.

Odd-numbered drain selection lines SGD02_0 to SGD02_*i* and odd-numbered source selection lines SGS02_0 to SGS02_*j* may be coupled to the odd-numbered memory block layers 110BL0 and 110BL2. Even-numbered drain selection lines SGD13_0 to SGD13_*i* and even-numbered source selection lines SGS13_0 to SGS13_*j* may be coupled to the even-numbered memory block layers 110BL1 and 110BL3. In other words, the drain selection lines SGD0_0 to SGD0_*i* and the source selection lines SGS0_0 to SGS0_*j* of the first memory block layer 110BL0 may be coupled to the drain selection lines SGD2_0 to SGD2_*i* and the source selection lines SGS2_0 to SGS2_*j* of the third memory block layer 110BL2. In addition, the drain selection lines SGD1_0 to SGD1_*i* and the source selection lines SGS1_0 to SGS1_*j* of the second memory block layer 110BL1 may be coupled to the drain selection lines SGD3_0 to SGD3_*i* and the source selection lines SGS3_0 to SGS3_*j* of the fourth memory block layer 110BL3.

As described above, the selection lines SGD0_0 to SGD0_*i*, SGS0_0 to SGS0_*j*, SGD2_0 to SGD2_*i* and SGS2_0 to SGS2_*j* of the odd-numbered memory block layers 110BL0 and 110BL2 and the selection lines SGD1_0 to SGD1_*i*, SGS1_0 to SGS1_*j*, SGD3_0 to SGD3_*i*, SGS3_0 to SGS3_*j* of the even-numbered memory block layers 110BL1 and 110BL3 may be separated from each other.

In addition, the drain selection lines SGD0_0 to SGD0_*i*, SGD1_0 to SGD1_*i*, SGD2_0 to SGD2_*i* and SGD3_0 to SGD3_*i* of the first to fourth memory block layers 110BL0 to 11BL3 may be separated from each other, and the source selection lines SGS0_0 to SGS0_*j*, SGS1_0 to SGS1_*j*, SGS2_0 to SGS2_*j* and SGS3_0 to SGS3_*j* thereof may be separated from each other.

Referring again to FIG. 1, the voltage supply circuit 120 may apply operating voltages to the memory blocks for data input and output operations of a selected memory block among the memory blocks such as a read operation, a program loop or an erase loop. A program loop may include a program operation and a program verification operation. In addition, the program loop may include an LSB program loop and an MSB program loop. The LSB program loop may include a LSB program operation and a LSB program verification operation, and the MSB program loop may include a MSB program operation and a MSB program verification operation. An erase loop may include an erase operation and an erase verification operation.

The voltage supply circuit 120 may apply a read voltage to a selected word line of selected memory cells during a read operation and a read pass voltage to unselected word lines of unselected memory cells. In addition, the voltage supply circuit 120 may apply a program voltage to a selected word line of selected memory cells during a program operation and a program pass voltage to unselected word lines of unselected memory cells. In addition, the voltage supply circuit 120 may apply a negative voltage of, for example, −10V to the word lines WL0 to WLn of the memory cells during an erase operation.

The operating voltages applied to the selected memory block through the word lines WL0 to WLn, the common source line SL and the bit lines BLA0 to BLAk and BLB0 to BLBk may also be applied to unselected memory blocks located over or under the selected memory block. Therefore, the voltage supply circuit 120 may control the operating voltages applied to selection lines of the unselected memory blocks so that a read operation, a program loop or an erase loop may be performed on the selected memory block, which may reduce an interference phenomenon or a disturbance phenomenon in the unselected memory blocks.

The voltage supply circuit 120 may include drain selection line drivers, word line drivers, source selection line drivers and a common source line driver. A first drain selection line driver, a first word line driver and a first source selection line driver may form a single driver group. The single driver group may control each of the operating voltages applied to the word lines WL0 to WLn and the selection lines SGD0_0 to SGD0_$i$, SGD1_0 to SGD1_$i$, SGD2_0 to SGD2_$i$, SGD3_0 to SGD3_$i$, SGS0_0 to SGS_$i$, SGS1_0 to SGS1_$i$, SGS2_0 to SGS2_$i$ and SGS3_0 to SGS3_$i$, which are shared by the memory blocks included in each of the memory block layers 110BL0 to 110BL3. That is, the number of driver groups may correspond to the number of memory blocks included in each of the memory block layers.

Referring to FIG. 1, the read/write circuit group 130 may be coupled to the memory blocks included in the memory block layers 110BL0 to 110B3 through the bit lines BLA0 to BLAk and BLB0 to BLBk. In addition, the read/write circuit group 130 may selectively precharge or discharge the selected bit lines BLA0 to BLAk and BLB0 to BLBk in response to data stored in the memory cells during the program operation. The read/write circuit group 130 may sense voltage variations or current variations of the selected bit lines BLA0 to BLAk and BLB0 to BLBk during a program verification operation and a read operation and may latch the data stored in the memory cells. The read/write circuit group 130 may include a page buffer.

The read/write circuit group 130 may include a first read/write circuit unit 130A coupled to the lower bit lines BLA0 to BLAk and a second read/write circuit unit 130B coupled to the upper bit lines BLB0 to BLBk. Specific components are described below in detail.

Hereinafter, embodiments of a method of coupling upper bit lines/lower bit lines and a read/write circuit group are described below.

Figure 8:
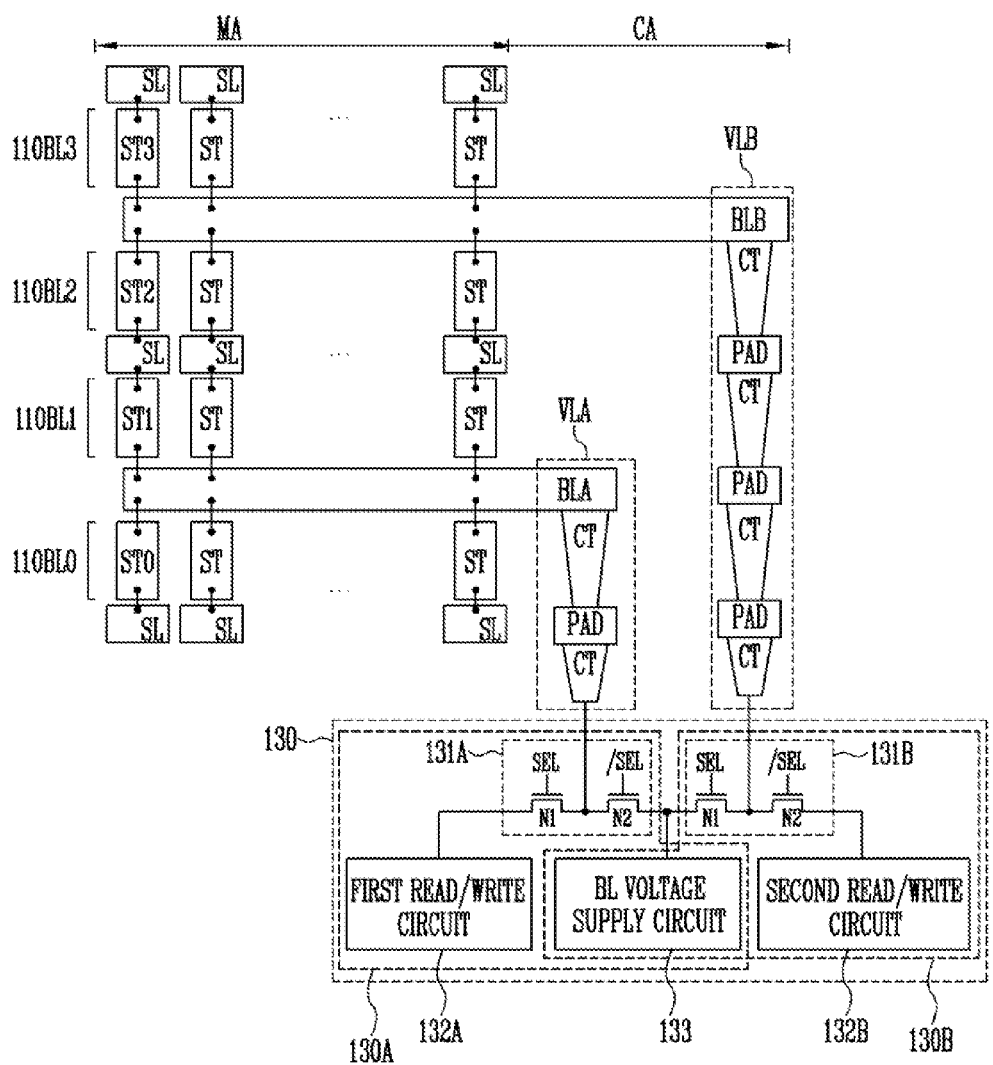
FIGS. 8 to 10 are views illustrating a coupling relationship between a memory array and a read/write circuit group according to embodiments of the present invention.
Figure 9:
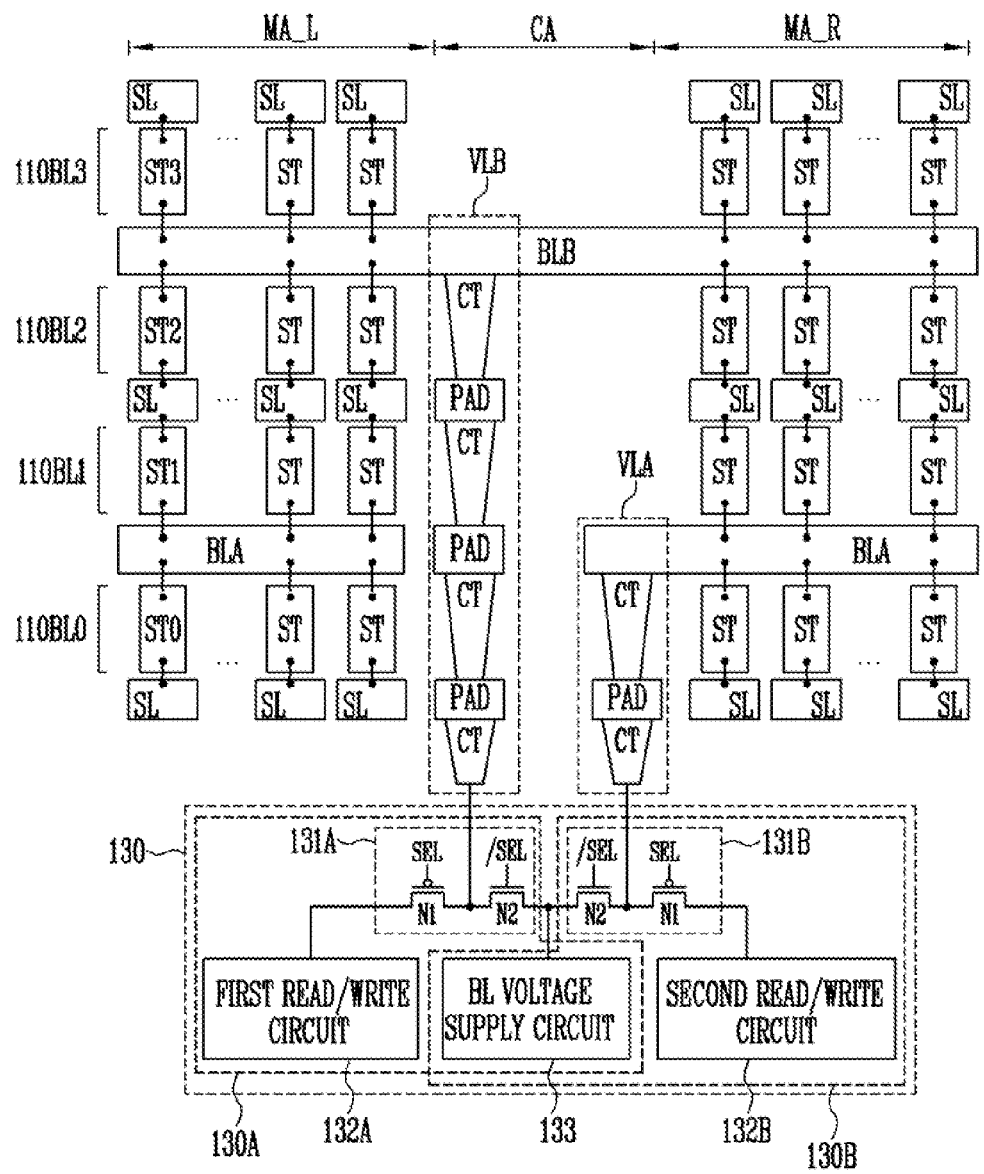
Figure 10:
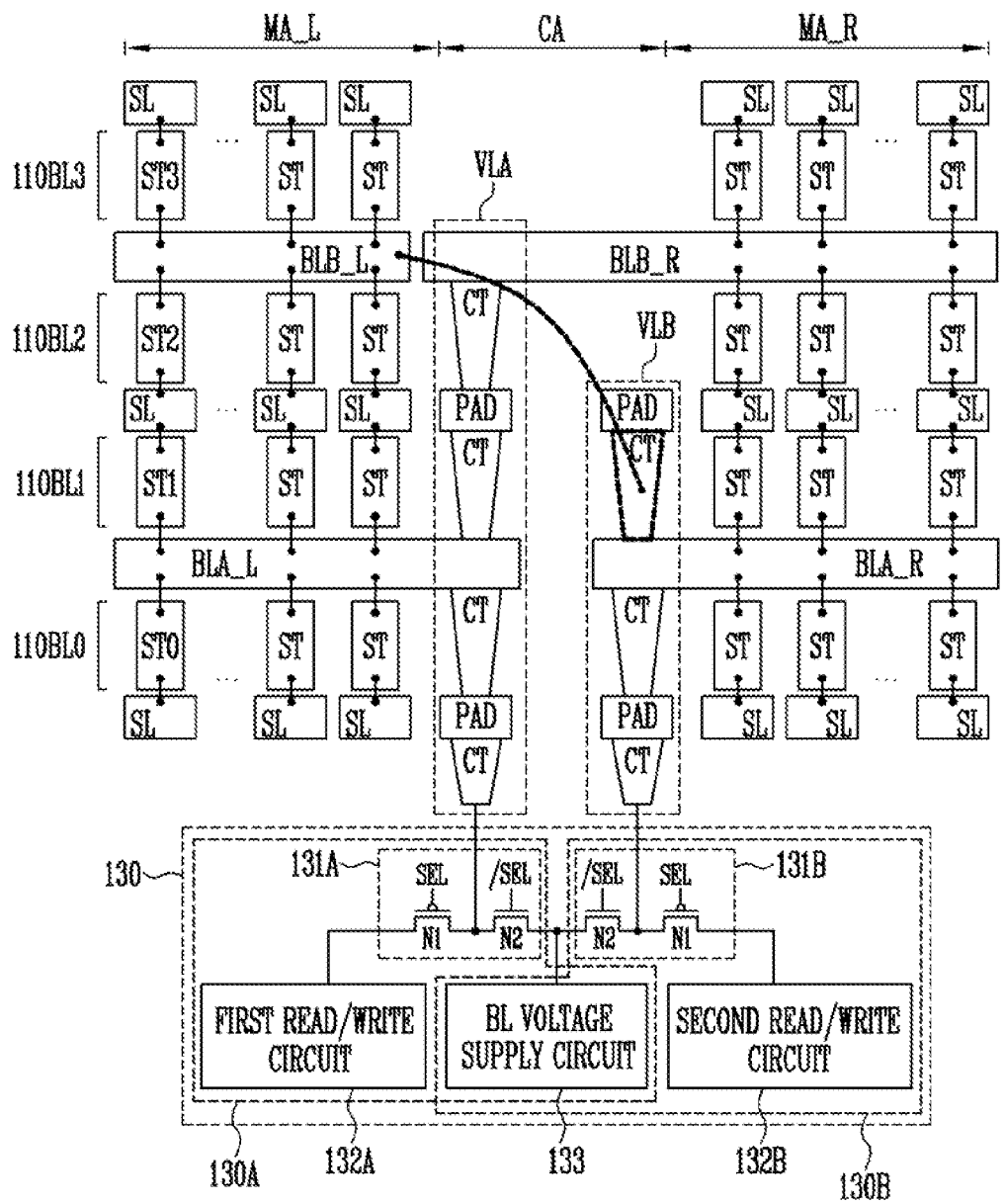

FIGS. 8 to 10 are views illustrating a coupling relationship between a memory array and a read/write circuit group according to embodiments of the present invention.

Referring to FIG. 8, a lower bit line BLA shared by the first and second memory block layers 110BL0 and 110BL1 and an upper bit line BLB shared by the third and fourth memory block layers 110BL2 and 110BL3 may be coupled to the read/write circuit group 130 through vertical lines VLA and VLB, respectively. The vertical lines VLA and VLB may include contact plugs CT and contact pads PAD. The contact plugs CT may be formed in the same layers as memory strings ST and the contact pads PAD may be formed in the same layers as the common source lines SL and the bit lines BLA and BLB.

The first vertical line VLA may couple the lower bit line BLA of the first and second memory block layers 110BL0 and 110BL1 to a first bit line switching circuit 131A of a first read/write circuit unit 130A. The second vertical lines VLB may couple the upper bit line BLB of the third and fourth memory block layers 110BL2 and 110BL3 to a second bit line switching circuit 131B of a second read/write circuit unit 130B. The vertical lines VLA and VLB may be formed in a contact region CA that is defined at the edge of a memory array MA.

The first read/write circuit unit 130A coupled to the lower bit line BLA may include the first bit line switching circuit 131A, a first read/write circuit 132B and a BL voltage supply circuit 133. The first bit line switching circuit 131A may include a transistor N1 operating in response to a bit line selection signal SEL and a transistor N2 operating in response to an inverted bit line selection signal /SEL. In response to the bit line selection signal SEL and the inverted bit line selection signal /SEL, the first bit line switching circuit 131A may couple the lower bit line BLA to the first read/write circuit 132A when the lower bit line BLA is selected, and the first bit line switching circuit 131A may couple the lower bit line BLA to the BL voltage supply circuit 133 when the lower bit line BLA is not selected. When the lower bit line BLA is coupled to the first read/write circuit 132A, a program loop or a read operation may be performed. When the lower bit line BLA is coupled to the BL voltage supply circuit 133, the BL voltage supply circuit 133 may apply a program inhibit voltage, for example, power voltage to the lower bit line BLA during a program operation and a ground voltage, for example, 0V or a precharge voltage to the lower bit line BLA during a read operation.

The second read/write circuit unit 130B coupled to the upper bit line BLB may include a second bit line switching circuit 131B, a second read/write circuit 132B and the BL voltage supply circuit 133. The BL voltage supply circuit 133 may be shared by the first and second read/write circuit units 130A and 130B. The second read/write circuit unit 130B may operate in substantially the same manner as the first read/write circuit unit 130A operates.

Referring to FIG. 9, the first vertical line VLA, which couples the lower bit line BLA shared by the first and second memory block layers 110BL0 and 110BL1 to the read/write circuit group 130, and the second vertical line VLB, which couples the upper bit line BLB shared by the third and fourth memory block layers 110BL2 and 110BL3 to the read/write circuit group 130, may be located at the center of the memory array. That is, the memory blocks of the memory block layers 110BL0, 110BL1, 110BL2 and 110BL3 may be divided into two memory block groups MA_L and MA_R. The first and second vertical lines VLA and VLB, which connect the lower and upper bit lines BLA and BLB to the read/write circuit group 130, respectively, may be formed between the memory block groups MA_L and MA_R.

Referring to FIG. 10, the memory blocks of the memory block layers 110BL0, 110BL1, 110BL2 and 110BL3 may be divided into the two memory block groups MA_L and MA_R. Bit lines BLA_L and BLB_L of the first memory block group MA_L may be separated from bit lines BLA_R and BLB_R of the second memory block group MA_R, respectively. In addition, the first vertical line VLA may be formed between the memory block groups MA_L and MA_R. The first vertical line VLA may couple the lower bit line BLA_L of the first memory block group MA_L and the upper bit line BLB_R of the second memory block group MA_R to the first bit line switching circuit 131A of the read/write circuit group 130. In addition, the second vertical line VLB may be formed between the memory block groups MA_L and MA_R. The second vertical line VLB may couple the upper bit line BLB_L of the first memory block group MA_L and the lower bit line BLA_R of the second memory block group MA_R to the second bit line switching circuit 131B of the read/write circuit group 130.

Figure 11A:
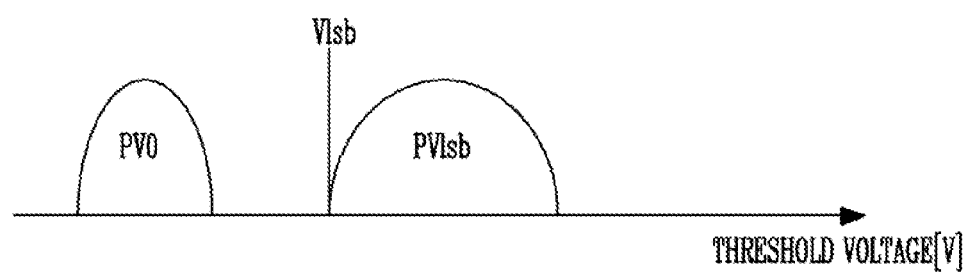
FIGS. 11A and 11B are distribution charts of threshold voltages illustrating a method of operating a semiconductor memory device according to embodiments of the present invention.
Figure 11B:
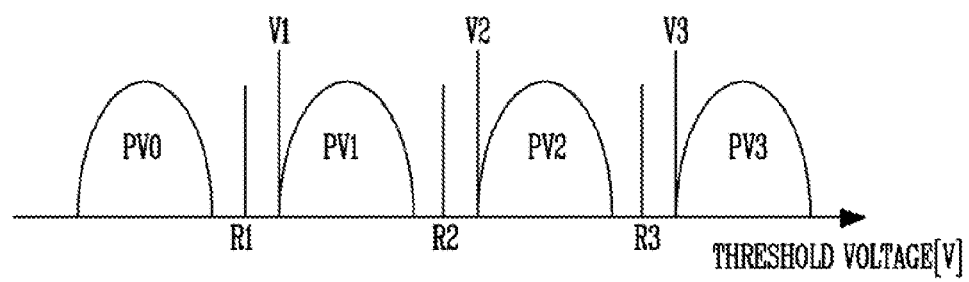

FIGS. 11A and 11B are distribution charts of threshold voltages illustrating a method of operating a semiconductor memory device according to embodiments of the present invention.

Referring to FIG. 11A, the entirety of memory cells of the selected memory block remain erased through an erase operation before a program loop is performed in order to store data in the memory cells. As a result, threshold voltages of the memory cells may be distributed around an erase level PV0.

When an LSB program loop to store LSB data in the memory cells is completed, threshold voltages of the memory cells may be distributed around either the erase level PV0 or an LSB level PVlsb, depending on the stored LSB data. The LSB program loop may include an LSB program operation and an LSB program verification operation. An LSB verify voltage Vlsb may be used during the LSB program verification operation.

Referring to FIG. 11B, when an MSB program loop is completed to store MSB data in the memory cells, the threshold voltages of the memory cells may be distributed around the erase level PV0 and first to third program levels PV1, PV2 and PV3, depending on the stored LSB data and the stored MSB data. The MSB program loop may include an MSB program operation and an MSB program verification operation. First, second and third program verify voltages V1, V2 and V3 may be used during the MSB program verification operation.

A read operation may include an LSB read operation and an MSB read operation. A second read voltage R2 may be used during the LSB read operation, and first and third read voltages R1 and R3 may be used during the MSB read operation.

Figure 12:
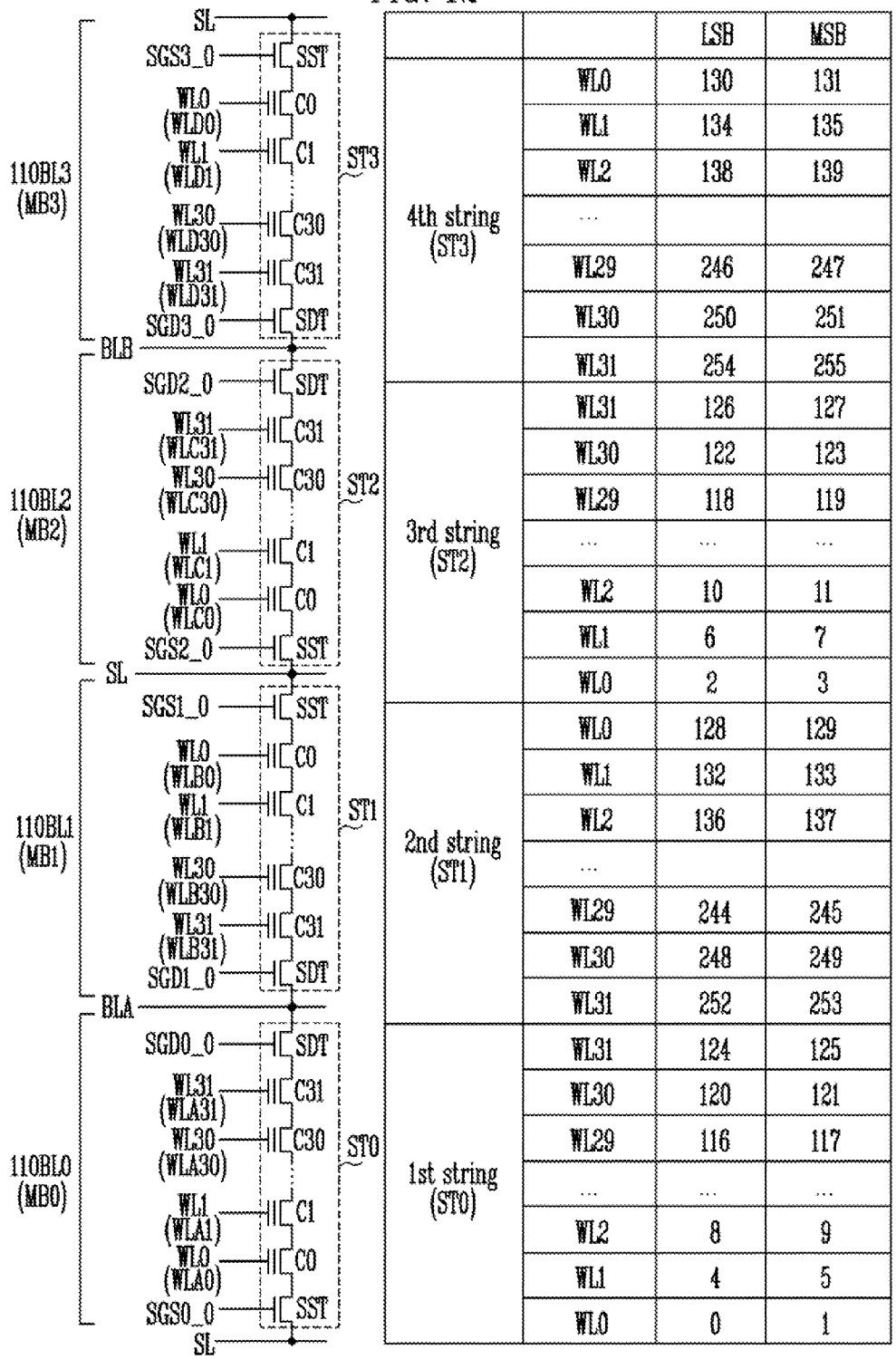
FIG. 12 is a view illustrating a method of operating a semiconductor memory device according to an embodiment of the present invention.

FIG. 12 is a view illustrating a method of operating a semiconductor memory device.

FIG. 13 is a flowchart illustrating a method of operating a semiconductor memory device according to an embodiment of the present invention.

Figure 14A:
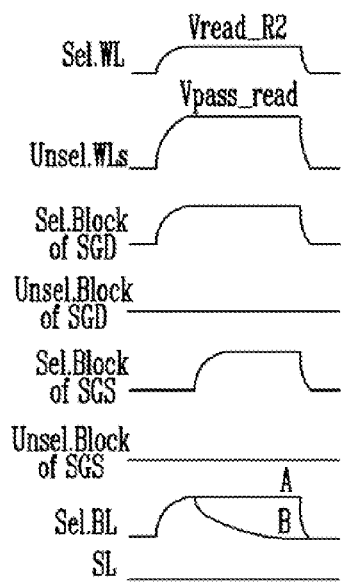
FIGS. 14A to 14C are waveforms illustrating a method of operating a semiconductor memory device according to an embodiment of the present invention.
Figure 14B:
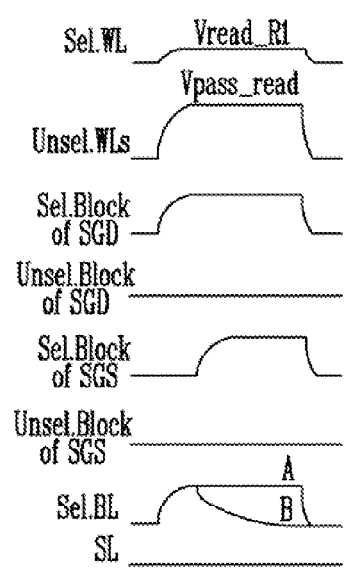
Figure 14C:
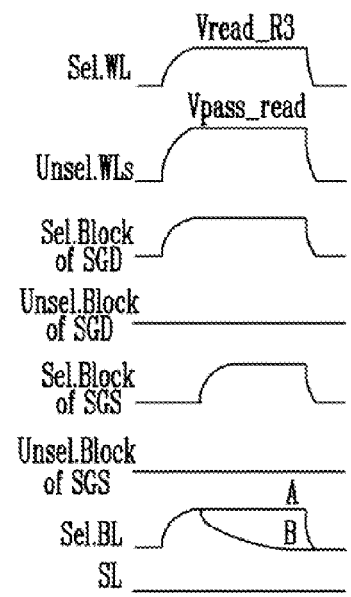

FIGS. 14A to 14C are waveforms illustrating a method of operating a semiconductor memory device according to an embodiment of the present invention.

Referring to FIG. 12, when the selection lines SGD0_0 to SGD3_0 and SGS0_0 to SGS3_0 of the first to fourth memory blocks MB0 to MB3, which are selected from the first to fourth memory block layers 110BL0 to 110BL3, respectively, are separated from each other, the BL voltage supply circuit 133 (not shown) may apply the same voltages for a read operation or a program loop to the word lines WLA0 to WLAn, WLB0 to WLBn, WLC0 to WLCn and WLD0 to WLDn of the first to fourth memory blocks MB0 to MB3 and different voltages to the selection lines SGD0_0 to SGD3_0 and SGS0_0 to SGS3_0 of the first to fourth memory blocks MB0 to MB3.

The read/write circuit group 130 (not shown) coupled to the lower bit line BLA and the upper bit line BLB and may apply operating voltages to the common word lines WL0 to WLn may perform a read operation or a program loop while the word lines WLA0 to WLAn of the first memory block MB0 and the word lines WLC0 to WLCn of the third memory block MB2 are alternately selected. Subsequently, the read/write circuit group 130 may perform a read operation or a program loop while the word lines WLB0 to WLBn of the second memory block MB1 and the word lines WLD0 to WLDn of the fourth memory block MB3 are alternately selected.

That is, the read/write circuit group 130 (not shown) may perform a read operation or a program loop to a selected word line, for example, WLA0 in the first memory block MB0 and may subsequently perform a read operation or a program loop to a selected word line, for example, WLC0 in the third memory block MB2. When a read operation or a program loop of each of the memory cells included in the first and third memory blocks MB0 and MB2 is completed, a read operation or a program loop may be performed to a selected word line, for example, WLB0 in the second memory block MB1 and a read operation or a program loop may be subsequently performed to a selected word line, for example, WLD0 in the fourth memory block MB3.

Since the word lines WLA0 to WLAn, WLB0 to WLBn, WLC0 to WLCn and WLD0 to WLDn of the memory blocks MB0 to MB3 are coupled to each other, the BL voltage supply circuit 133 (not shown) may apply voltages for a read operation or a program loop to the word lines WL0 to WLn as described with reference to in FIGS. 6 and 7. Therefore, since the same voltages are applied to the word lines WLA0 to WLAn, WLB0 to WLBn, WLC0 to WLCn and WLD0 to WLDn of the first to fourth memory blocks MB0 to MB3, the BL voltage supply circuit 133 (not shown) may apply different voltages to the selection lines SGD0_0 to SGD3_0 and SGS0_0 to SGS3_0 in order to select one word line from a predetermined memory block among the word lines WLA0 to WLAn, WLB0 to WLBn, WLC0 to WLCn and WLD0 to WLDn of the first to fourth memory blocks MB0 to MB3. That is, one word line may be selected in response to voltages applied to the selection lines SGD0_0 to SGD3_0 and SGS0_0 to SGS3_0.

As described above, when an LSB read operation and an MSB read operation are performed to the first to fourth memory blocks MB0 to MB3, the word lines WLA0 to WLAn, WLB0 to WLBn, WLC0 to WLCn and WLD0 to WLDn may be selected sequentially. In substantially the same manner, when the LSB program loop and the MSB program loop are performed to the memory blocks MB0 to MB3, the word lines WLA0 to WLAn, WLB0 to WLBn, WLC0 to WLCn and WLD0 to WLDn may be sequentially selected, which is described below.

Referring to FIG. 13, at step S1301, a read operation may be performed to odd-numbered memory block layers. At step S1301, a read command and an address signal may be input for the read operation. At step S1303, the first common word line WL0 may be selected in response to the address signal.

At step S1305, an LSB read operation may be performed on a lower memory block. In other words, the LSB read operation may be performed on memory cells coupled to the first word line WLA0 of the first memory block MB0 in response to the address signal. Referring to FIGS. 11A and 14A, a precharge voltage may be applied to the selected lower bit line BLA and a precharge voltage or a ground voltage may be applied to the unselected upper bit line BLB. The LSB read voltage R2 may be applied to a selected word line, for example, WL0 and a read pass voltage Vpass_read may be applied to the other word lines WL1 to WLn.

A positive voltage, for example, 4V may be applied to the drain selection line, for example, SGD0_0 of the selected memory block, for example, MB0, and a ground voltage or a negative voltage may be applied to the selection lines, for example, SGD1_0, SGD2_0, SGD3_0, SGS1_0 and SGS2_0, SGS3_0 of the unselected memory blocks, for example, MB1 to MB3 so that the LSB read operation is performed only on the selected memory block MB0. Subsequently, when a positive voltage is applied to the source selection line, for example, SGS0_0 of the selected memory block, for example, MB0, the precharged voltage of a bit line A of a memory cell having a greater threshold voltage than an LSB read voltage Vread_R1 may be maintained and a bit line B of a memory cell having a threshold voltage may be discharged.

The first read/write circuit unit 130A (not shown) may sense changes in the voltage of the bit line BLA and latch data stored in the memory cell according to a sensing result. In this manner, the LSB read operation may be completed.

At step S1307, an MSB read operation may be performed on the lower memory block. That is, the MSB read operation may be performed on the memory cells coupled to the first word line WLA0 of the first memory block MB0 in response to the address signal. The MSB read operation may be performed using the first MSB read voltage Vread_R1 and a second MSB read voltage Vread_R3. Referring to FIGS. 11B and 14B, the first MSB read voltage Vread_R1 may be applied as a read voltage and the MSB read operation may be performed in substantially the same manner as the LSB read operation. Subsequently, referring to FIGS. 11B and 14C, the second MSB read voltage Vread_R3 may be applied as the read voltage, and the MSB read operation may be performed in the same manner as the LSB read operation.

At step S1309, an LSB read operation may be performed on an upper memory block. In other words, the LSB read operation may be performed on the memory cells coupled to the first word line WLC0 of the third memory block MB2 in response to the address signal. The LSB read operation may be performed in substantially the same manner as described with respect to step S1305.

At step S1311, the MSB read operation may be performed on the memory cells coupled to the first word line WLC0 of the third memory block MB2 in response to the address signal. The MSB read operation at S1311 may be performed in substantially the same manner as described with respect to step S1307.

At step S1313, it may be determined whether the selected word line is the last word line of the upper memory block or the memory block MB2. When the selected word line is not the last word line, the next word line, for example, WL1 may be selected at step S1315. After the LSB read operation and the MSB read operation are performed on the memory cells coupled to the selected word line, for example, WLA1 of the first memory block MB0 at steps S1305, S1307, S1309 and S1311, the LSB read operation and the MSB read operation may be performed on the memory cells coupled to the selected word line, for example, WLC1 of the third memory block MB2.

When it is determined that the read operation of the last word line, for example, WLn of the upper memory block or the memory block MB2 is completed at step S1313, it is determined whether or not the read operation of all of the memory blocks is completed at step S1317. That is, it may be determined whether or not the read operation of all of the memory blocks included in all of the memory block layers is completed. When it is determined that the read operation of all of the memory blocks included in all of the memory block layers is not completed, memory blocks included in the even-numbered memory block layers may be selected at step S1319. Subsequently, a read operation with steps S1305, S1307, S1309, S1311, S1313 and S1315 may be performed to the memory cells of the even-numbered memory block layers while the word lines WLB0 to WLBn and WLD0 to WLDn included in the second and fourth memory blocks MB1 and MB3 are selected sequentially.

The read operation may be completed when it is determined that the read operation of all of the memory blocks in all of the memory block layers is completed at step S1317.

Figure 15:
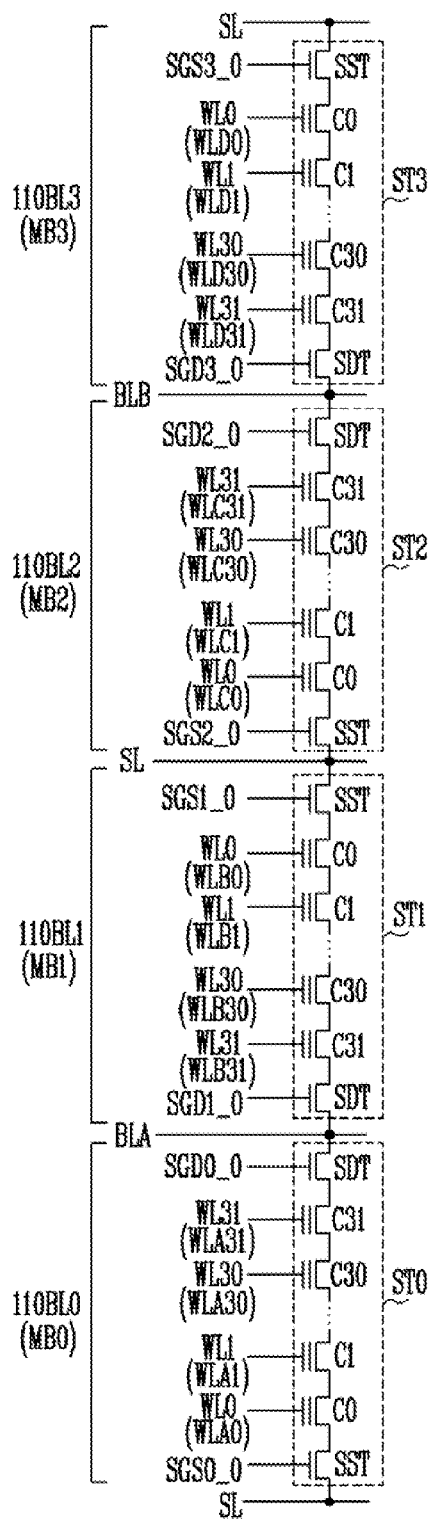
FIG. 15 is a view illustrating a method of operating a semiconductor memory device according to an embodiment of the present invention.

FIG. 15 is a view illustrating a method of operating a semiconductor memory device according to another embodiment of the present invention.

FIGS. 16 to 19 are flowcharts illustrating a method of operating a semiconductor memory device according to another embodiment of the present invention.

FIGS. 20A to 20E are waveforms s illustrating a method of operating a semiconductor memory device according to another embodiment of the present invention.

Referring to FIG. 15, when the selection lines SGD0_0 to SGD3_0 and SGS0_0 to SGS3_0 of the first to fourth memory blocks MB0 to MB3 are separated from each other, the read/write circuit group 130 (not shown), which may apply operating voltages to the word lines WL0 to WLn coupled to each of the upper bit line BLB and the lower bit line BLA, may perform LSB read operations or LSB program loops to selected word lines of the first and third memory blocks MB0 and MB2 and may perform MSB read operations or MSB program loops to the selected word lines. Subsequently, the read/write circuit group 130 (not shown) may perform LSB read operations or LSB program loops on selected word lines of the second and fourth memory blocks MB1 and MB3 and may perform MSB read operations or MSB program loops on the selected word lines of the second and fourth memory blocks MB1 and MB3.

That is, the read/write circuit group 130 (not shown) may perform an LSB read operation or an LSB program loop to a selected word line, for example, WLA0 of the first memory block MB0 and may perform subsequently an LSB read operation or an LSB program loop to a selected word line, for example, WLC0 of the third memory block MB2. Subsequently, the read/write circuit group 130 (not shown) may perform an MSB read operation or an MSB program loop to the selected word line, for example, WLA0 in the first memory block MB0 and may subsequently perform an MSB read operation or an MSB program loop to the selected word line, for example, WLC0 in the third memory block MB2. When the read operation or the program loop of each of the memory cells included in the first and third memory blocks MB0 and MB2 is completed, the read/write circuit group 130 (not shown) may perform an LSB read operation or an LSB program loop to a selected word line, for example, WLB0 in the second memory block MB1 and subsequently perform an LSB read operation or an LSB program loop to a selected word line, for example, WLD0 in the fourth memory block MB3. Subsequently, the read/write circuit group 130 (not shown) may perform an MSB read operation or an MSB program loop to the selected word line, for example, WLB0 in the second memory block MB1 and may perform subsequently an MSB read operation or an MSB program loop to the selected word line, for example, WLD0 in the fourth memory block MB3.

As described above, when the LSB read operation and the MSB read operation are performed on the first to fourth memory blocks MB0 to MB3, the word lines WLA0 to WLAn, WLB0 to WLBn, WLC0 to WLCn and WLD0 to WLDn may be selected sequentially. In substantially the same manner, when the LSB program loop and the MSB program loop are performed on the memory blocks MB0 to MB3, the word lines WLA0 to WLAn, WLB0 to WLBn, WLC0 to WLCn and WLD0 to WLDn may be sequentially selected, which is described below.

Referring to FIG. 16, at step S1601, a read operation may be performed to odd-numbered memory block layers. At step S1601, a read command and an address signal may be input. At step S1603, the first common word line WL0 may be selected in response to the address signal.

At step S1605, an LSB read operation may be formed on a lower memory block. That is, the LSB read operation may be performed on the memory cells coupled to the first word line WLA0 of the first memory block MB0 in response to the address signal. The LSB read operation may be performed in substantially the same manner as described with respect to step S1305 of FIG. 13.

At step S1607, an LSB read operation may be performed on the upper memory block. That is, the LSB read operation may be performed on the memory cells coupled to the first word line WLC0 of the third memory block MB2 in response to the address signal. The LSB read operation may be performed in substantially the same manner as described with respect to step S1309 of FIG. 13.

At step S1609, an MSB read operation may be performed on the lower memory block. That is, the MSB read operation may be performed on the memory cells coupled to the first word line WLA0 of the first memory block MB0 in response to the address signal. The MSB read operation may be performed in substantially the same manner as described with respect to step S1307 of FIG. 13.

At step S1611, an MSB read operation may be performed on an upper memory block. That is, the MSB read operation may be performed on the memory cells coupled to the first word line WLC0 of the third memory block MB2 in response to the address signal. The MSB read operation may be performed in substantially the same manner as described with respect to step S1311 of FIG. 13.

At step S1613, it may be determined whether the selected word line is the last word line of the upper memory block or the first memory block MB2. When it is determined that the selected word line is not the last word line, the next common word line, for example, WL1 may be selected at step S1615, and steps S1605 to S1611 may be repeated.

When it is determined that the read operation of the last word line, for example, WLn of the upper memory block or the memory block MB2 is completed at step S1613, it may be determined whether the read operation of all of the memory blocks is completed at step S1617. When the read operation of all of the memory blocks included in all of the memory block layers is not completed, the memory blocks included in the even-numbered memory block layers may be selected at step S1619. Subsequently, the read operation with steps S1603 to S1615 of all of the memory cells of the even-numbered memory block layers may be performed while the word lines WLB0 to WLBn and WLD0 to WLDn included in the second and fourth memory blocks MB1 and MB3 are sequentially selected.

The read operation may be completed when it is determined that the read operation of all of the memory blocks in all of the memory block layers is completed at step S1617.

Referring to FIG. 17, at step S1701, a read operation may be performed to odd-numbered memory block layers. At step S1701, a read command and an address signal may be input. At step S1703, the first common word line WL0 may be selected in response to the address signal. The LSB read operation of steps S1705 and S1707 may be performed in substantially the same manner as described with respect to steps S1305 and S1307 of FIG. 13.

An MSB read operation may be performed while the word lines of the upper memory block and the lower memory block are alternately selected. That is, step S1609 of FIG. 16 may correspond to step S1709 and step S1713 and step S1611 of FIG. 16 may correspond to step S1711 and step S1715.

At step S1709, the MSB read operation may be performed to the selected word line of the lower memory block by using the first MSB read voltage Vread_R1 shown in FIG. 14B. At step S1711, the MSB read operation may be performed to the selected word line of the upper memory block by using the first MSB read voltage Vread_R1 shown in FIG. 14B. At step S1713, the MSB read operation may be performed to the selected word line of the lower memory block by using the second MSB read voltage Vread_R3 shown in FIG. 14C. At step S1715, the MSB read operation may be performed to the selected word line of the upper memory block by using the second MSB read voltage Vread_R3 shown in FIG. 14C.

At step S1717, it may be determined whether the selected word line is the last word line of the upper memory block or the first memory block MB2. When it is determined that the selected word line is not the last word line, the next common word line, for example, WL1 may be selected at step S1719, and steps S1705 to S1715 may be repeated.

When it is determined that the read operation of the last word line, for example, WLn of the upper memory block or the memory block MB2 is completed at step S1717, it may be determined whether the read operation of all of the memory blocks is completed at step S1721. When the read operation of all of the memory blocks included in all of the memory block layers is not completed, the memory blocks included in the even-numbered memory block layers may be selected at step S1723. Subsequently, the read operation with steps S1703 to S1719 of all of the memory cells of the even-numbered memory block layers may be performed while the word lines WLB0 to WLBn and WLD0 to WLDn included in the second and fourth memory blocks MB1 and MB3 are sequentially selected.

The read operation may be completed when it is determined that the read operation of all of the memory blocks in all of the memory block layers is completed at step S1721.

Referring to FIG. 18, at step S1801, a program loop may be performed on odd-numbered memory block layers. At step S1801, a program command, an address signal and data may be input. At step S1803, the first common word line WL0 may be selected in response to the address signal.

Figure 20A:
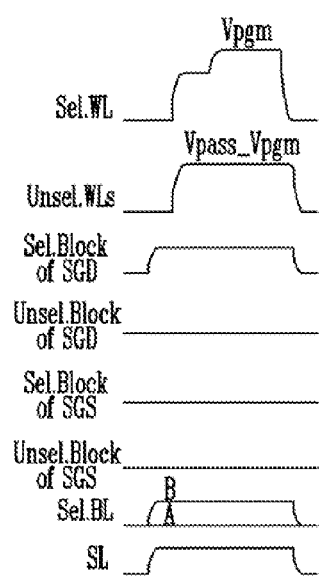
FIGS. 20A to 20E are waveforms illustrating a method of operating a semiconductor memory device according to another embodiment of the present invention.

At step S1805, an LSB program loop to a lower memory block may be performed. That is, the LSB program loop may be performed to the memory cells coupled to the first word line WLA0 of the first memory block MB0 in response to the address signal. Referring to FIGS. 11A and 20A, To perform the LSB program operation, the bit line A of the memory cell, in which data of '0' is stored, may be discharged and the bit line B of the memory cell to store data of '1' may be precharged. A positive voltage may be applied to the drain selection line SGD0_0 of the selected memory block MB0, and a ground voltage may be applied to the source selection line SGS0_0. A positive voltage may be applied to the common source line. Subsequently, a program pass voltage Vpass_pgm may be applied to the word lines WL0 to WLn and a program voltage Vpgm may be applied to the selected word line WL0. A threshold voltage of the memory cell coupled to the discharged bit line A may increase under the above-described conditions.

A ground voltage or a negative voltage may be applied to the selection lines, for example, SGD1_0, SGD2_0, SGD3_0, SGS1_0, SGS2_0 and SGS3_0 of the unselected memory blocks MB1 to MB3 so that the LSB program operation may be performed to only the selected memory block MB0.

Figure 20B:
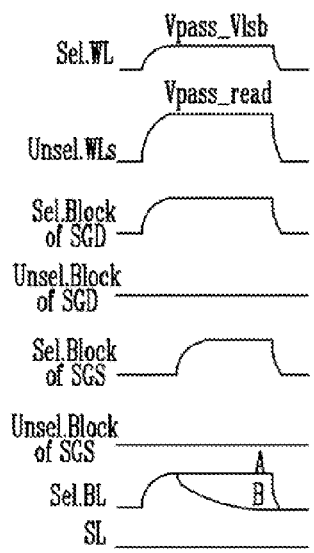

Subsequently, referring to FIGS. 11A and 20B, an LSB program verification operation may be performed. The LSB program verification operation may be performed in substantially the same manner as the LSB read operation described with respect to step S1305 of FIG. 13. However, instead of the read voltage, an LSB verify voltage Vread_Vlsb may be applied to the selected word line.

At step S1807, an LSB program loop to the upper memory block may be performed. That is, the LSB program loop to the memory cells coupled to the first word line WLC0 of the third memory block MB2 may be performed in response to the address signal in substantially the same manner as described with respect to step S1805.

At step S1809, an MSB program loop may be performed to the lower memory block. That is, the MSB program loop to the memory cells coupled to the first word line WLA0 of the first memory block MB0 may be performed in response to the address signal. Referring to FIGS. 11B and 20A, the MSB program operation may be first performed in substantially the same manner as the LSB program operation of step S1805. However, during the MSB program operation, the program voltage Vpgm having a higher voltage level than that of the LSB program operation may be applied to the word line.

Subsequently, referring to FIGS. 11B and 20B to 20D, an MSB program verification operation may be performed. The MSB program verification operation may be performed in substantially the same manner as the LSB read operation described with respect to step S1305 of FIG. 13. However, instead of the read voltage, MSB verify voltages Vread_V1, Vread_V2 and Vread_V3 may be applied to the selected word line. That is, the MSB program verification operation may be performed three times using the MSB verify voltages Vread_V1, Vread_V2 and Vread_V3.

At step S1811, an MSB program loop may be performed to the upper memory block. That is, in response to the address signal, the MSB program loop to the memory cells coupled to the first word line WLC0 of the third memory block MB2 may be performed in substantially the same manner as described with respect to step S1809.

It may be determined whether or not the word line is the last word line of the upper memory block or the memory block MB2 at step S1813. When the word line is not the last word line, the next common word line, for example, WL1 may be selected at step S1815, and steps S1805 to S1811 may be repeated.

When it is determined that the program loop of the last word line, for example, WLn is completed at step S1813, it may be determined whether the program loop of all of the memory blocks is completed at step S1817. When the program loop is not completed on every memory block included in all of the memory block layers, the memory blocks included in the even-numbered memory block layers may be selected at step S1819. Subsequently, the program loop to the memory cells with steps S1803 to S1815 may be performed while the word lines WLB0 to WLBn and WLD0 to WLDn included in the second and fourth memory blocks MB1 and MB3 are sequentially selected.

The program loop may be completed when it is determined that the program loop of all of the memory blocks in all of the memory block layers is completed at step S1817.

Referring to FIG. 19, at step S1901, a program loop may be performed to odd-numbered memory block layers. At step S1901, a program command, an address signal and data may be input. At step S1903, the first common word line WL0 may be selected in response to the address signal. The LSB program operation of steps S1905 and S1907 and the MSB program operation of steps S1913 and S1915 may be performed in substantially the same manner as described with respect to steps S1805, S1807, S1809 and S1811 of FIG. 18. The LSB program verification operation of steps S1909 and S1911 may be performed.

The MSB program verification operation may be performed while the word lines of the upper memory block and the lower memory block are alternately selected. That is, step S1809 of FIG. 18 may correspond to steps S1917, S1921 and S1925 at which the MSB program verification operation is performed. Step S1811 of FIG. 18 may correspond to steps S1919, S1923 and S1927 at which the MSB program verification operation is performed.

Figure 20C:
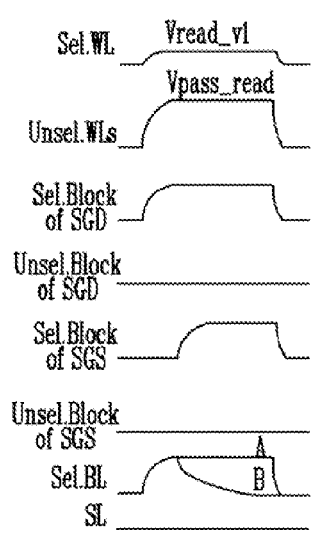
Figure 20D:
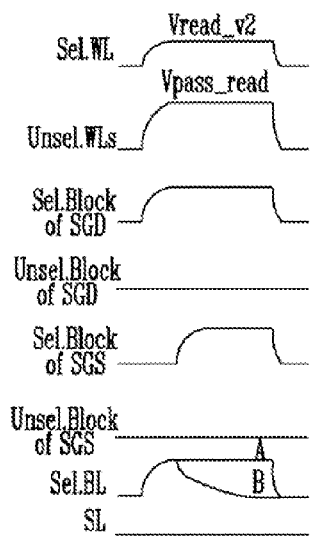
Figure 20E:
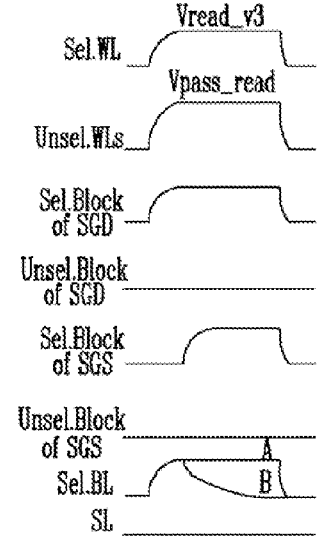

At step S1917, an MSB program verification operation may be performed to the selected word line of the lower memory block by using the first MSB program verify voltage Vread_V1 shown in FIG. 20C. At step S1919, an MSB program verification operation may be performed to the selected word line of the upper memory block by using the first MSB program verify voltage Vread_V1 shown in FIG. 20C. At step S1921, an MSB program verification operation may be performed to the selected word line of the lower memory block by using the second MSB program verify voltage Vread_V2 shown in FIG. 20D. At step S1923, the MSB program verification operation may be performed to the selected word line of the upper memory block by using the second MSB program verify voltage Vread_V2 shown in FIG. 20D. At step S1925, the MSB program verification operation may be performed to the selected word line of the lower memory block by using the third MSB program verify voltage Vread_V3 shown in FIG. 20E. At step S1927, an MSB program verification operation may be performed to the selected word line of the upper memory block by using the third MSB program verify voltage Vread_V3 shown in FIG. 20E.

It may be determined whether or not the word line is the last word line of the upper memory block or the memory block MB2 at step S1929. When the word line is not the last word line, the next common word line, for example, WL1 may be selected at step S1931, and steps S1905 to S1927 may be repeated.

When it is determined that the program verification operation of the last word line, for example, WLn is completed at step S1929, it may be determined whether the program loop to all of the memory blocks is completed at step S1933. When the program loop is not completed on every memory block included in all of the memory block layers, the memory blocks included in the even-numbered memory block layers may be selected at step S1935. Subsequently, the program loop to the memory cells with steps S1903 to S1931 may be performed while the word lines WLB0 to WLBn and WLD0 to WLDn included in the second and fourth memory blocks MB1 and MB3 are sequentially selected.

The program loop may be completed when it is determined that the program loop of all of the memory blocks in all of the memory block layers is completed at step S1933.

Figure 21:
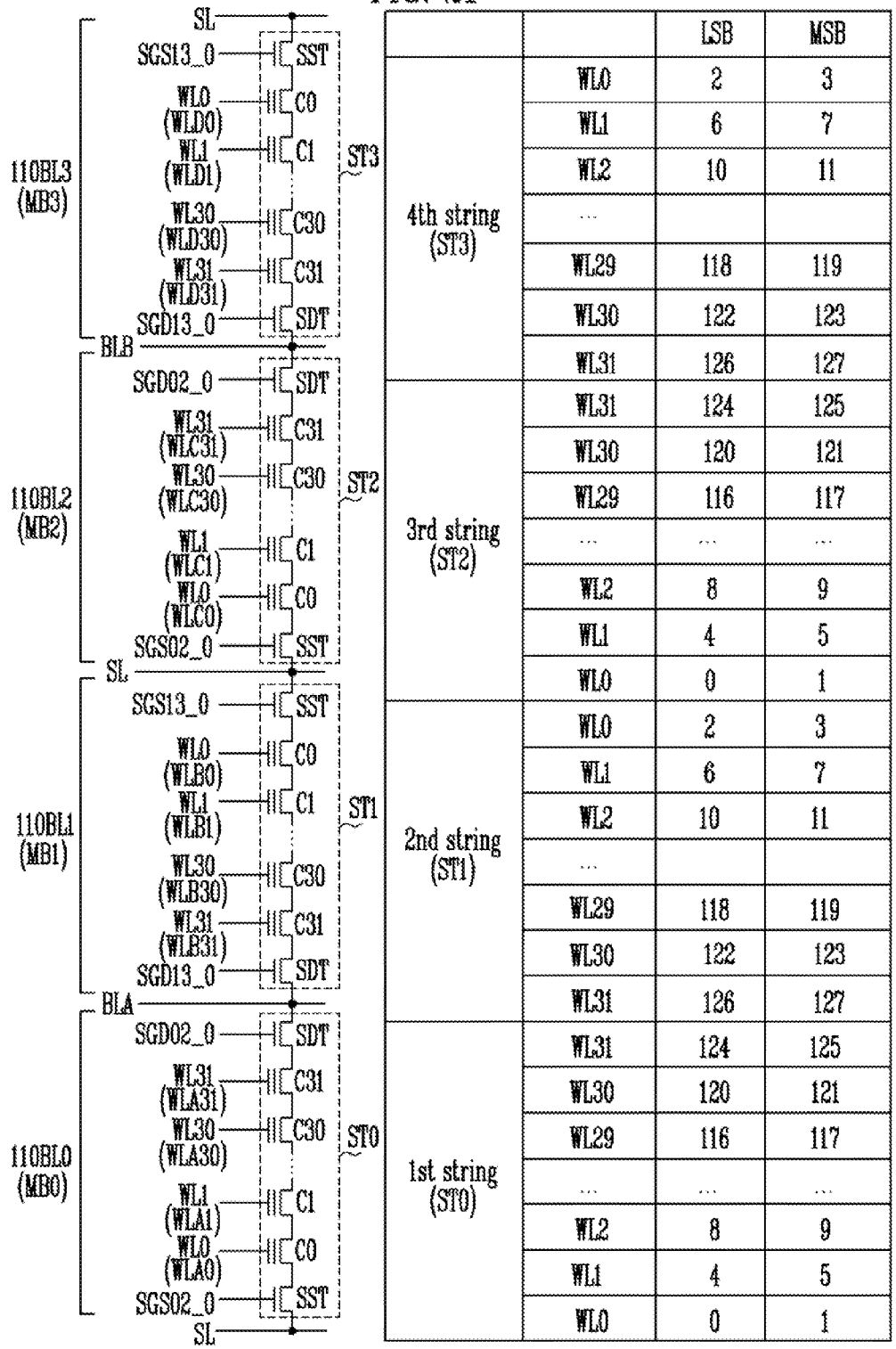
FIG. 21 is a view illustrating a method of operating a semiconductor memory device according to an embodiment of the present invention.

FIG. 21 is a view illustrating a method of operating a semiconductor memory device according to another embodiment of the present invention.

Figure 22:
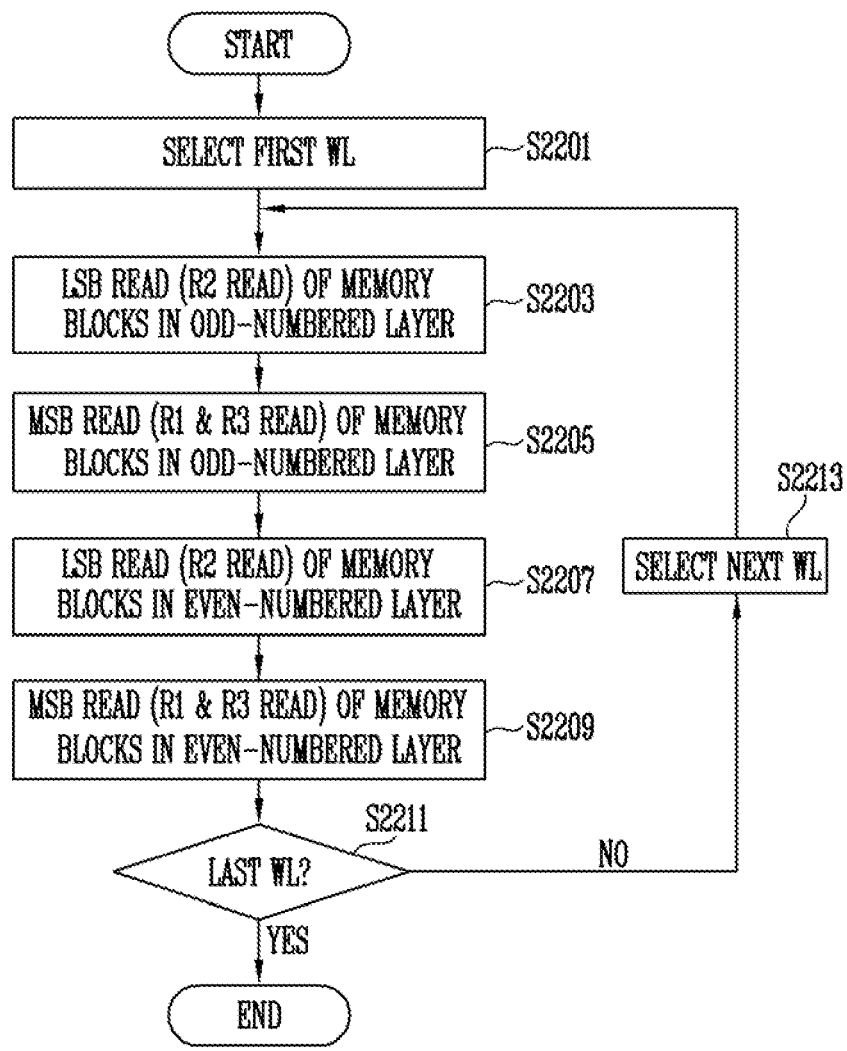
FIGS. 22 and 23 are flowcharts illustrating a method of operating a semiconductor memory device according to an embodiment of the present invention.
Figure 23:
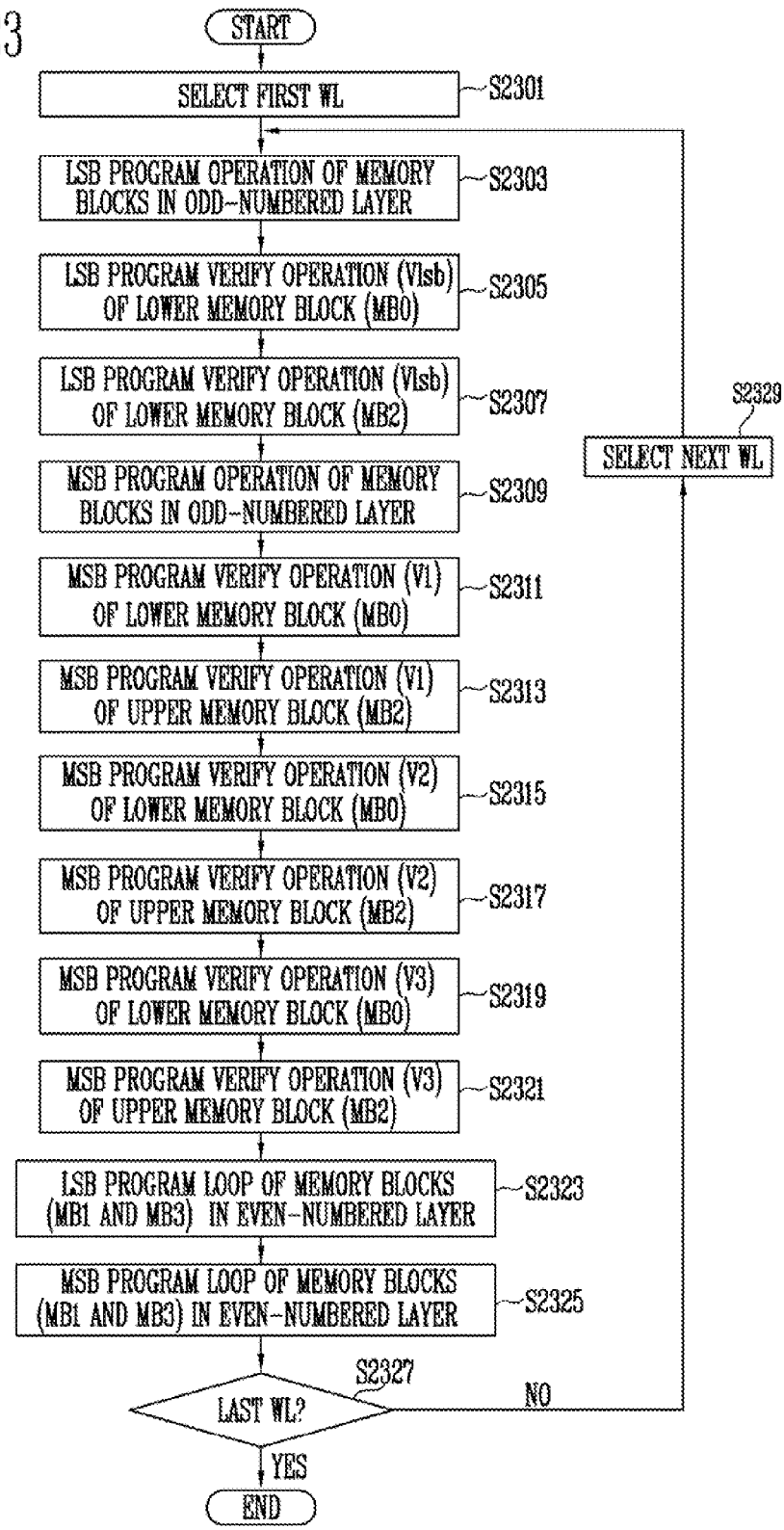

FIGS. 22 and 23 are flowcharts illustrating a method of operating a semiconductor memory device according to another embodiment of the present invention.

Referring to FIG. 21, the selection lines SGD02_0 and SGS02_0 of the first and third memory blocks MB0 and MB2 may be coupled to each other, and the selection lines SGD13_0 and SGS13_0 of the second and fourth memory blocks MB1 and MB3 may be coupled to each other. The BL voltage supply circuit 133 (not shown) may apply the same voltages for a read operation or a program loop to the word lines WL0 to WLn of the first to fourth memory blocks MB0 to MB3, the same voltages to the selection lines SGD02_0 and SGS02_0 of the first and third memory blocks MB0 and MB2 and the same voltages to the selection lines SGD13_0 and SGS13_0 of the second and fourth memory blocks MB1 and MB3.

The read/write circuit group 130 (not shown) coupled to the lower bit line BLA and the upper bit line BLB and the common word lines WL0 to WLn may simultaneously perform a read operation and a program loop to the word lines of the first and third memory blocks MB0 and MB1 and may simultaneously perform a read operation and a program loop to selected word lines of the second and fourth memory blocks MB1 and MB3.

In addition, the read/write circuit group 130 (not shown) may alternately perform the read operation or the program loop to the selected word lines of the first and third memory blocks MB0 and MB2 and the read operation or the program loop to the selected word lines of the second and fourth memory blocks MB1 and MB3. That is, after simultaneously performing the an LSB read operation and an MSB read operation or the LSB program loop and the MSB program loop to selected word lines of the first and third memory blocks MB0 and MB2, the read/write circuit group 130 (not shown) may simultaneously perform an LSB read operation and an MSB read operation or an LSB program loop and an MSB program loop to selected word lines of the second and fourth memory blocks MB1 and MB3.

Since the word lines WL0 to WLn of the memory blocks MB0 to MB3 are coupled to each other, the BL voltage supply circuit 133 (not shown) may apply voltages for a read operation or a program loop to the common word lines WL0 to WLn as described with reference to in FIGS. 6 and 7. Therefore, since the same voltages are applied to the word lines WL0 to WLn of the memory blocks MB0 to MB3 in order to simultaneously select a single word line from memory blocks of an odd-numbered layer or an even-numbered layer among the word lines WL0 to WLn of the memory blocks MB0 to MB3, the BL voltage supply circuit 133 (not shown) may apply different voltages to the selection lines SGD02_0 and SGS02_0 of the odd-numbered layer and the selection lines SGD13_0 and SGS13_0 of the even-numbered layer. That is, word lines may be simultaneously selected from memory blocks of an odd-numbered layer or an even-numbered layer in response to voltages applied to the selection lines SGD02_0, SGD13_0, SGS02_0 and SGS13_0.

As described above, when the LSB read operation and the MSB read operation are performed to the first to fourth memory blocks MB0 to MB3, two of the word lines WL0 to WLn of the first to fourth memory blocks MB0 to MB3 may be simultaneously selected sequentially. In substantially the same manner, when an LSB program loop and an MSB program loop are performed to the first to fourth memory blocks MB0 to MB3, two of the word lines WL0 to WLn of the first to fourth memory blocks MB0 to MB3 may be simultaneously selected sequentially, which is described below.

Referring to FIG. 22, when a read command and an address signal are input to perform a read operation, the first common word line WL0 may be selected in response to the address signal at step S2201.

At step S2203, an LSB read operation may be performed to the first and third memory blocks MB0 and MB2 of an odd-numbered layer. That Is, the LSB read operation may be simultaneously performed on the memory cells coupled to the first word lines WL0 of the first and third memory blocks MB0 and MB2 in response to the address signal. The LSB read operation may be performed using substantially the same method as described with respect to step S1305 of FIG. 13. However, in order to simultaneously perform the LSB read operation to the memory cells coupled to the first word lines WL0, the read/write circuit group 130 (not shown) coupled to the lower bit line BLA and the upper bit line BLB may be simultaneously operated. As described below, in order to perform a read operation or a program operation to memory cells coupled to two word lines that are selected simultaneously, the read/write circuit group 130 (not shown) coupled to the lower bit line BLA and the upper bit line BLB may be simultaneously operated.

At step S2205, an MSB read operation may be performed to the first and third memory blocks MB0 and MB2 of an odd-numbered layer. That is, the MSB read operation may be simultaneously performed on the memory cells coupled to the first word lines WL0 of the first and third memory blocks MB0 and MB2 in response to the address signal. The MSB read operation may be performed using substantially the same method as described with respect to step S1307 of FIG. 13.

At step S2207, an LSB read operation may be performed to the second and fourth memory blocks MB1 and MB3 of an even-numbered layer. That is, the LSB read operation may be simultaneously performed to the memory cells coupled to the first word lines WL0 of the second and fourth memory blocks MB1 and MB3 in response to the address signal. The LSB read operation may be performed as described with respect to step S1305 of FIG. 13.

At step S2209, the MSB read operation may be performed to the second and fourth memory blocks MB1 and MB3 of the even-numbered layer. That is, the MSB read operation may be simultaneously performed to the memory cells coupled to the first word lines WL0 of the second and fourth memory blocks MB1 and MB3 in response to the address signal. The LSB read operation may be performed using substantially the same method as described with respect to step S1307 of FIG. 13.

At step S2211, it may be determined whether or not the selected word line is the last word line. When the word line is not the last word line, the next common word line, for example, WL1 may be selected at step S2213, and steps S2203 to S2211 may be repeated. At step S2211, when it is determined that the read operation of the last word line, for example, WLn is completed, the read operation may be completed.

Since the word lines WL0 to WLn of the memory blocks MB0 to MB3 may be coupled to each other, the BL voltage supply circuit 133 (not shown) may apply voltages for a read operation or a program loop to the word lines WL0 to WLn as described with reference to in FIGS. 6 and 7. Therefore, the same voltages may be applied to the word lines WL0 to WLn of the memory blocks MB0 to MB3. In addition, since the selection lines SGS02_0 and SGD02_0 of the memory blocks MB0 and MB2 of the odd-numbered layer are coupled to each other, the same voltages may be applied to the selection lines SGS02_0 and SGD02_0. Since the selection lines SGS13_0 and SGD13_0 of the memory blocks MB1 and MB3 of the even-numbered layer are coupled to each other, the same voltages may be applied to the selection lines SGS13_0 and SGD13_0. At this time, voltages applied to the selection lines SGD02_0, SGD13_0, SGS02_0 and SGS13_0 by the BL voltage supply circuit 133 (not shown) during the read operation, as shown below in Table 1, may be controlled in order to simultaneously select a single word line from the memory blocks of the odd-numbered layer or the even-numbered layer among the word lines WL0 to WLn of the memory blocks MB0 to MB3.

TABLE 1

| | | | Read | Program | Erase | | | Read | Program | Erase |
|---|---|---|---|---|---|---|---|---|---|---|
| memory string(ST3) of 4th layer M/B (110BL3) | (Sharing SL & BL & WL with ST2_0) | BLB0 | 1 V | Vcc->0 V/Vcc | Floating | 4th layer unselected Memory block (Sharing BL with 110BL2) | BLB0 | 1 V | Vcc->0 V/Vcc | Floating |
| | | SGD13_0 | 0 V | 5 V -> 0 V or -2 V | 0 V | | SGD13_0' | 0 V | 0 V or -2 V | 0 V |
| | | WLn | Vpass_read | Vpass_pgm | -10 V | | WLn' | 0 V | 0 V | 0 V |
| | | ... | Vpass_read | Vpass_pgm | -10 V | | ... | 0 V | 0 V | 0 V |
| | | SEL_WL | Vread | Vpgm | -10 V | | WL' | 0 V | 0 V | 0 V |
| | | ... | Vpass_read | Vpass_pgm | -10 V | | ... | 0 V | 0 V | 0 V |
| | | WL0 | Vpass_read | Vpass_pgm | -10 V | | WL0 | 0 V | 0 V | 0 V |
| | | SGS13_0 | 0 V | 0 V or -2 V | 0 V or -2 V | | SGS13_0' | 0 V | 0 V | 0 V |
| | | SL | 0 V | Vcc | Verase(8 V) | | SL' | 0 V | 0 V | 0 V |

| | | | Read | Program | Erase | | | Read | Program | Erase |
|---|---|---|---|---|---|---|---|---|---|---|
| memory string(ST2_0) of 3rd layer M/B (110BL2) | (selected) | BLB0 | 1 V | Vcc->0 V/Vcc | Floating | 3rd layer unselected memory block (sharing BL with 110BL2) | BLB0 | 1 V | Vcc->0 V/Vcc | Floating |
| | | SGD02_0 | 4 V | 5 V->1.5 V | 0 V | | SGD02_0' | 0 V | 0 V or -2 V | 0 V |
| | | WLn | Vpass_read | Vpass_pgm | -10 V | | WLn' | 0 V | 0 V | 0 V |
| | | ... | Vpass_read | Vpass_pgm | -10 V | | ... | 0 V | 0 V | 0 V |
| | | SEL_WL | Vread | Vpgm | -10 V | | WL' | 0 V | 0 V | 0 V |
| | | ... | Vpass_read | Vpass_pgm | -10 V | | ... | 0 V | 0 V | 0 V |
| | | WL0 | Vpass_read | Vpass_pgm | -10 V | | WL0' | 0 V | 0 V | 0 V |
| | | SGS02_0 | 4 V | 0 V or -2 V | Verase(8 V) | | SGS02_0' | 0 V | 0 V | |
| | | SL | 0 V | Vcc | Verase(8 V) | | SL' | 0 V | 0 V | 0 V |

| | | | Read | Program | Erase |
|---|---|---|---|---|---|
| memory string(ST2_i) of 3rd layer M/B (110BL2) | (Sharing SL & WL with ST2_0) | BLBk | 1 V | Vcc->0 V/Vcc | Floating |
| | | SGD02_1 | 0 V or -2 V | 5 V -> 0 V or -2 V | 0 V |
| | | WLn | Vpass_read | Vpass_pgm | -10 V |
| | | ... | Vpass_read | Vpass_pgm | -10 V |
| | | SEL_WL | Vread | Vpgm | -10 V |
| | | ... | Vpass_read | Vpass_pgm | -10 V |
| | | WL0 | Vpass_read | Vpass_pgm | -10 V |
| | | SGS02_i | 4 V | 0 V or -2 V | Verase(8 V) |
| | | SL | 0 V | Vcc | Verase(8 V) |

| | | | Read | Program | Erase | | | Read | Program | Erase |
|---|---|---|---|---|---|---|---|---|---|---|
| memory string(ST1) of 2nd layer M/B (110BL1) | (Sharing SL & BL & WL with ST0) | BLA0 | 1 V | Vcc->0 V/Vcc | Floating | 2nd layer unselected Memory block (sharing BL with 110BL0) | BLA0 | 1 V | Vcc->0 V/Vcc | Floating |
| | | SGD13_0 | 0 V | 5 V -> 0 V or -2 V | 0 V | | SGD13_0' | 0 V | 0 V or -2 V | 0 V |
| | | WLn | Vpass_read | Vpass_pgm | -10 V | | WLn' | 0 V | 0 V | 0 V |
| | | ... | Vpass_read | Vpass_pgm | -10 V | | ... | 0 V | 0 V | 0 V |
| | | SEL_WL | Vread | Vpgm | -10 V | | WL' | 0 V | 0 V | 0 V |
| | | ... | Vpass_read | Vpass_pgm | -10 V | | ... | 0 V | 0 V | 0 V |
| | | WL0 | Vpass_read | Vpass_pgm | -10 V | | WL0' | 0 V | 0 V | 0 V |
| | | SGS13_0 | 0 V | 0 V or -2 V | 0 V or -2 V | | SGS13_0' | 0 V | 0 V | 0 V |
| | | SL | 0 V | Vcc | Verase(8 V) | | SL' | 0 V | 0 V | 0 V |

| | | | Read | Program | Erase | | | Read | Program | Erase |
|---|---|---|---|---|---|---|---|---|---|---|
| Memory string(ST0) of 1st layer M/B (110BL0) | (selected) | BLA0 | 1 V | Vcc->0 V/Vcc | Floating | 1st layer unselected Memory block (sharing BL with 110BL0) | BLA0 | 1 V | Vcc->0 V/Vcc | Floating |
| | | SGD02_0 | 4 V | 5 V -> 1.5 V | 0 V | | SGD02_0' | 0 V | 0 V or -2 V | 0 V |
| | | WLn | Vpass_read | Vpass_pgm | -10 V | | WLn' | 0 V | 0 V | 0 V |
| | | ... | Vpass_read | Vpass_pgm | -10 V | | ... | 0 V | 0 V | 0 V |
| | | SEL_WL | Vread | Vpgm | -10 V | | WL' | 0 V | 0 V | 0 V |
| | | ... | Vpass_read | Vpass_pgm | -10 V | | ... | 0 V | 0 V | 0 V |
| | | WL0 | Vpass_read | Vpass_pgm | -10 V | | WL0' | 0 V | 0 V | 0 V |
| | | SGS02_0 | 4 V | 0 V or -2 V | Verase(8 V) | | SGS02_0' | 0 V | 0 V | 0 V |
| | | SL | 0 V | Vcc | Verase(8 V) | | SL' | 0 V | 0 V | 0 V |

Referring to FIGS. 6 and 21 and Table 1, since selected memory strings ST0 and ST2 and unselected memory strings ST1 and ST3 share the word lines WL0 to WLn and the common source line SL, the same operating voltages, for example, read voltage, program voltage, pass voltage and so forth may be applied to the memory strings ST0, ST1, ST2_0 and ST3. In order to block a read operation, a program operation or an erase operation of the unselected memory strings ST1 and ST3, different operating voltages may be applied to the drain selection lines SGD02_0 and SGD13_0, and different operating voltages may be applied to the source selection lines SGS02_0 and SGS13_0.

For example, in order to block the read operation of the unselected memory strings ST1 and ST3, a ground voltage may be applied to the selection lines SGS13_0 and SGD13_0 of the unselected memory strings ST1 and ST3. Selection transistors of the unselected memory strings ST1 and ST3 may be turned off by a ground voltage and the unselected memory strings ST1 and ST3 may be separated from the bit line BLB and the common source line SL. As a result, the unselected memory strings ST1 and ST3 may not affect the read operation.

Referring to FIGS. 21 and 23, a program loop to memory cells may be performed sequentially. When a program command, an address signal and data are input to perform a program loop, the first common word line WL0 may be selected in response to the address signal at step S2301. The LSB program operation to odd-numbered memory block layers of step S2303 and the MSB program operation to odd-numbered memory block layers of step S2309 may be performed in substantially the same manner as described with respect to steps S1905, S1907, S1913 and S1915 of FIG. 19. The LSB program verification operation of steps S2305 and S2307 may be performed.

An MSB program verify order of steps S2311 to S2321 may be substantially the same as the MSB program verify order of steps S1917 to S1927 as described with respect to FIG. 19. However, the MSB program verify order of steps S2313 to S2321 may be different from the MSB program verify order of steps S1917 to S1927. When a program operation or a program verification operation is performed, word lines may be simultaneously selected from memory blocks of an odd-numbered layer or an even-numbered layer. That is, a program operation or a program verification operation may be performed while two memory strings, for example, ST0 and ST2 are simultaneously selected. The method of simultaneously selecting two word lines may be similar to the method described in connection with the read operation described with respect to FIG. 22.

In like manner, LSB and MSB program loops to even-numbered memory block layers may be performed at steps S2323 and S2325.

At step S2327, it may be determined whether or not the selected word line is the last word line. When the word line is not the last word line, the next common word line, for example, WL1 may be selected at step S2329, and steps S2303 to S2327 may be repeated. At step S2327, when it is determined that the program loop of the last word line, for example, WLn is completed, the program loop may be completed.

When a program operation or a program verification operation may be performed to the selected memory strings ST0 and ST2, for blocking a program operation or a program verification operation of the unselected memory strings ST1 and ST3, a positive voltage, for example, 5V may be applied to the drain selection lines SGD13_0 of the unselected memory strings ST1 and ST3 in order to precharge a channel and a ground voltage, for example, 0V or a negative voltage, for example, −2V may subsequently be applied thereto. A ground voltage or a negative voltage may be applied to the source selection line SGS13_0. When the pass voltage Vpass_pgm is applied, the drain selection transistor may be turned off and the unselected memory strings ST1 and ST3 may be separated from the bit line BLB. As a result, a channel voltage of the unselected memory strings ST1 and ST3 may be increased due to a boosting phenomenon and the memory cells of the unselected memory strings ST1 and ST3 may be program-inhibited.

As described above, since word lines are simultaneously selected from memory blocks of an odd-numbered layer or an even-numbered layer, the capacity of a page may be doubled during a read operation or a program operation.

In order to block an erase operation of the unselected memory strings ST1 and ST3, a ground voltage, for example, 0V or a negative voltage, for example, −2V may be applied to the selection lines SGS13_0 and SGD13_0 of the unselected memory strings ST1 and ST3. As a result, a channel voltage of the unselected memory strings ST1 and ST3 may be increased due to a boosting phenomenon and the memory cells included in the unselected memory strings ST1 and ST3 may be erase-inhibited.

Figure 24:
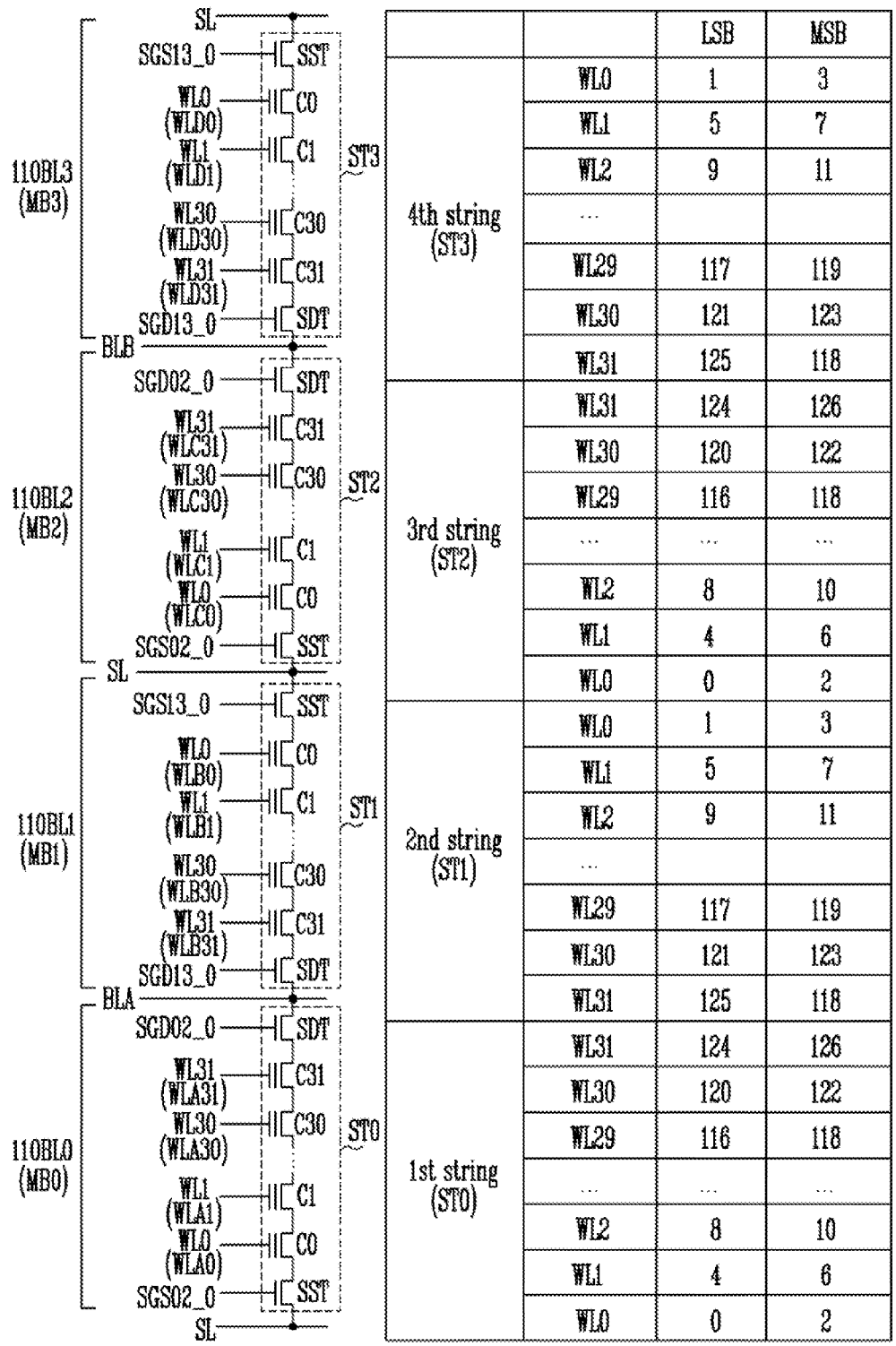
FIG. 24 is a view illustrating a method of operating a semiconductor memory device according to an embodiment of the present invention.

FIG. 24 is a view illustrating a method of operating a semiconductor memory device according to another embodiment of the present invention.

Figure 25:
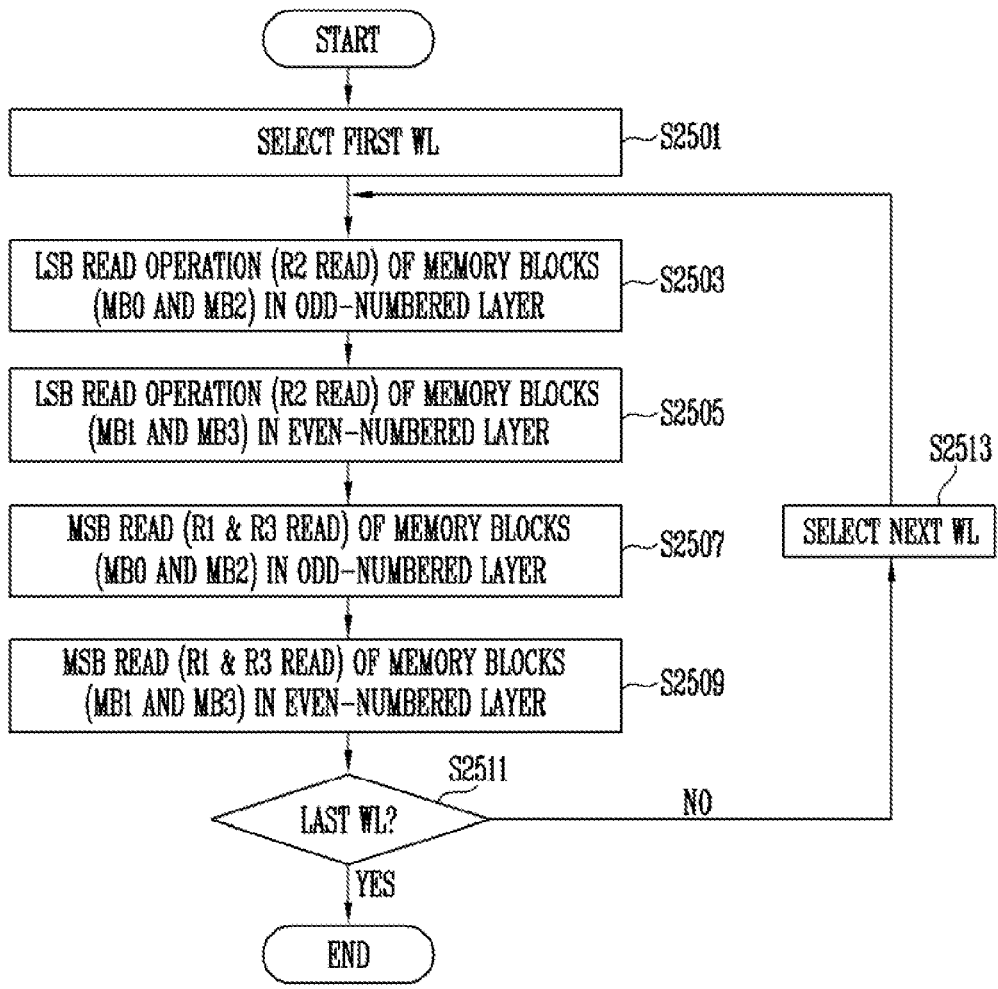
FIGS. 25 to 27 are flowcharts illustrating a method of operating a semiconductor memory device according to an embodiment of the present invention.
Figure 26:
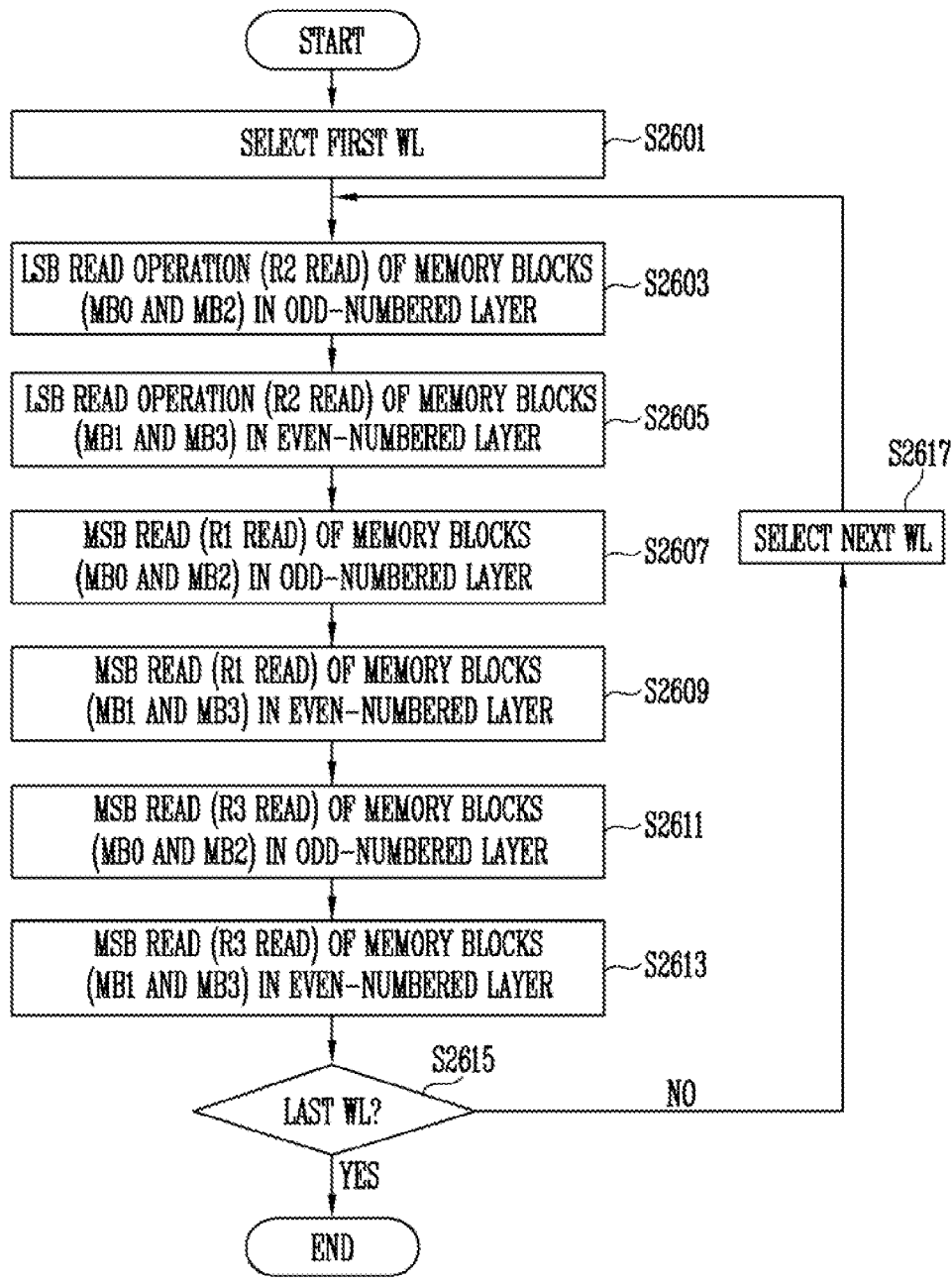
Figure 27:
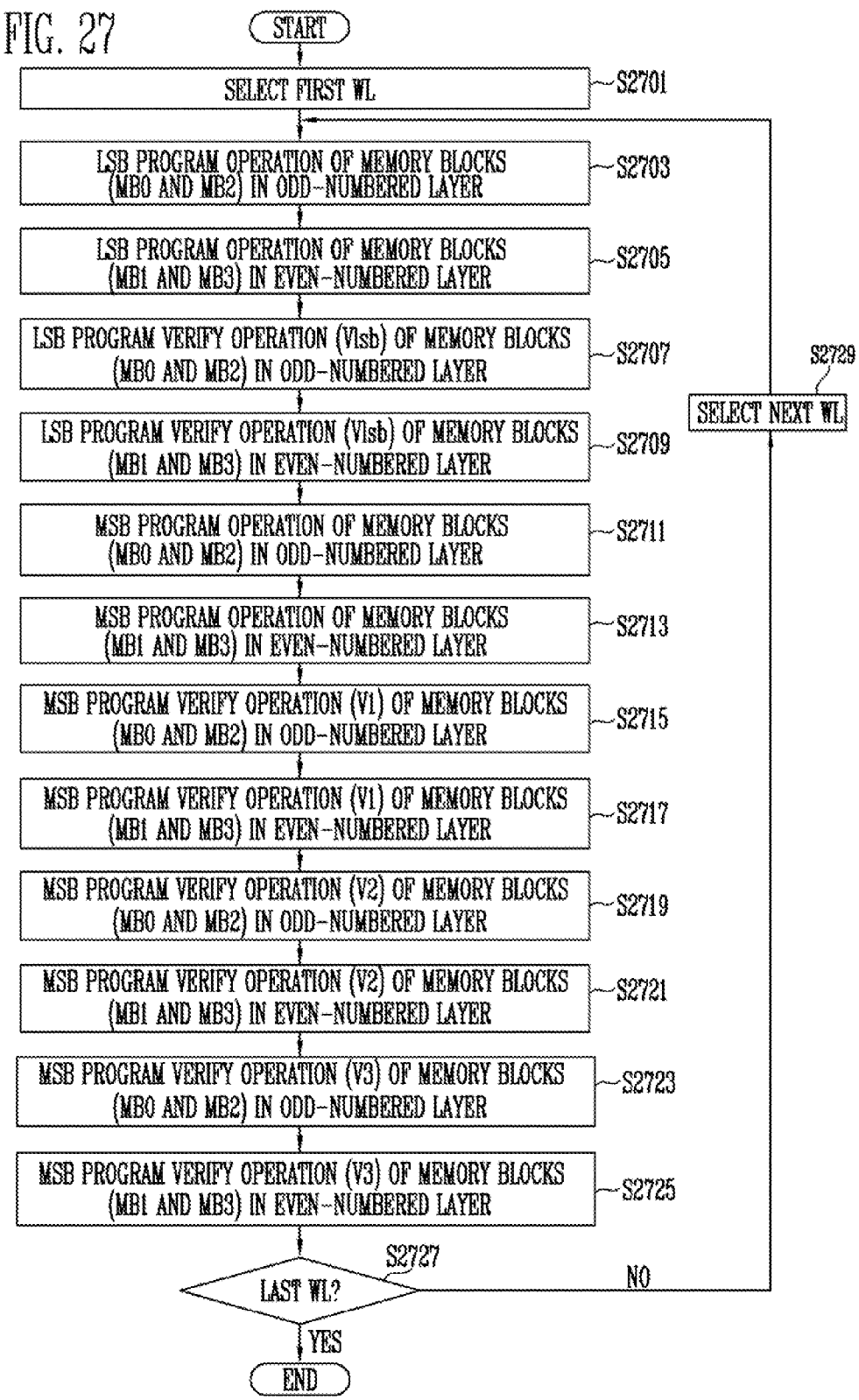

FIGS. 25 to 27 are flowcharts illustrating a method of operating a semiconductor memory device according to another embodiment of the present invention.

Referring to FIG. 24, the selection lines SGD02_0 and SGS02_0 of the first and third memory blocks MB0 and MB2 may be coupled to each other, and the selection lines SGD13_0 and SGS13_0 of the second and fourth memory blocks MB1 and MB3 may be coupled to each other. The read/write circuit group 130 (not shown) coupled to the upper bit line BLB and the lower bit line BLA and the word lines WL0 to WLn may perform an LSB read operation or an LSB program loop to word lines, for example, WL0 simultaneously selected from the first and third memory blocks MB0 and MB2 and an LSB read operation or an LSB program loop on word lines, for example, WL0 simultaneously selected from the second and fourth memory blocks MB1 and MB3. Subsequently, the read/write circuit group 130 (not shown) may be configured to perform an MSB read operation or an MSB program loop on the word lines, for example, WL0 simultaneously selected from the first and third memory blocks MB0 and MB2 and an MSB read operation or an MSB program loop on word lines, for example, WL0 simultaneously selected from the second and fourth memory blocks MB1 and MB3.

That is, the first and second read/write circuits and the voltage supply circuit may perform the LSB read operation or the LSB program loop to the selected word lines, for example, WL0 in the first and third memory blocks MB0 and MB2 and subsequently perform the LSB read operation or the LSB program loop to the selected word lines, for example, WL0 in the second and fourth memory blocks MB1 and MB3. Subsequently, the MSB read operation or the MSB program loop may be performed to the selected word lines, for example, WL0 in the first and third memory blocks MB0 and MB2 and the MSB read operation or the MSB program loop may be performed to the selected word lines, for example, WL0 in the second and fourth memory blocks MB1 and MB3.

As described above, when the LSB read operation and the MSB read operation are performed to the memory blocks MB0 to MB3, the word lines WL0 to WLn may be selected sequentially. In substantially the same manner, when the LSB program loop and the MSB program loop are performed to the memory blocks MB0 to MB3, the word lines WL0 to WLn may be selected sequentially, which is described below.

Referring to FIGS. 24 and 25, at step S2501, when a read command and an address signal are input to perform a read operation, the first common word line WL0 may be selected in response to the address signal.

At step S2503, an LSB read operation may be performed to the first and third memory blocks MB0 and MB2 of the odd-numbered layer. That is, the LSB read operation may be simultaneously performed to the memory cells coupled to the first word lines WL0 of the first and third memory blocks MB0 and MB2 in response to the address signal. The LSB read operation may be performed in substantially the same manner as described with respect to step S1305 of FIG. 13.

At step S2505, an LSB read operation may be performed to the second and fourth memory blocks MB1 and MB3 of the even-numbered layer. That is, the LSB read operation may be simultaneously performed to the memory cells coupled to the first word lines WL0 of the second and fourth memory blocks MB1 and MB3 in response to the address signal. The LSB read operation may be performed in substantially the same manner as described with respect to step S1305 of FIG. 13.

At step S2507, an MSB read operation may be performed to the first and third memory blocks MB0 and MB2 of the odd-numbered layer. That is, the MSB read operation may be simultaneously performed to the memory cells coupled to the first word lines WL0 of the first and third memory blocks MB0 and MB2 in response to the address signal. The MSB read operation may be performed in substantially the same manner as described with respect to step S1307 of FIG. 13.

At step S2509, an MSB read operation may be performed to the second and fourth memory blocks MB1 and MB3 of the even-numbered layer. That is, the MSB read operation may be simultaneously performed on the memory cells coupled to the first word lines WL0 of the second and fourth memory blocks MB1 and MB3 in response to the address signal. The LSB read operation may be performed in substantially the same manner as described with respect to step S1307 of FIG. 13

It may be determined whether a word line is the last word line at step S2511. When the word line is not the last word line, the next common word line, for example, WL1 may be selected at step S2513, and steps S2503 to S2511 may be repeated. When it is determined that the read operation of the last word line, for example, WLn is completed at step S2511, the read operation may be completed.

Referring to FIGS. 24 and 26, at step S2501, when a read command and an address signal are input to perform a read operation, the first common word line WL0 may be selected in response to the address signal.

At step S2603, an LSB read operation may be performed to the first and third memory blocks MB0 and MB2 of the odd-numbered layer. That is, the LSB read operation may be simultaneously performed to the memory cells coupled to the first word lines WL0 of the first and third memory blocks MB0 and MB2 in response to the address signal. The LSB read operation may be performed in substantially the same manner as described with respect to step S1305 of FIG. 13.

At step S2505, an LSB read operation may be performed to the second and fourth memory blocks MB1 and MB3 of the even-numbered layer. That is, the LSB read operation may be simultaneously performed to the memory cells coupled to the first word lines WL0 of the second and fourth memory blocks MB1 and MB3 in response to the address signal. The LSB read operation may be performed in substantially the same manner as described with respect to step S1305 of FIG. 13.

An MSB read operation may be performed while word lines of memory blocks of an odd-numbered layer and memory blocks of an even-numbered layer are alternately selected. That is, step S2507 of FIG. 25 may correspond to step S2607 and step S2611 and step S2509 may correspond to S2609 and step S2613.

In this example, at step S2607, the MSB read operation may be performed to selected word lines of the memory blocks of the odd-numbered layer by using the first MSB read voltage Vread_R1. At step S2609, the MSB read operation may be performed to selected word lines of the memory blocks of the even-numbered layer by using the first MSB read voltage Vread_R1. At step S2611, the MSB read operation may be performed to the selected word lines of the memory blocks of the odd-numbered layer by using the second MSB read voltage Vread_R3. At step S2613, the MSB read operation may be performed to the selected word lines of the memory blocks of the even-numbered layer by using the second MSB read voltage Vread_R3.

It may be determined whether a word line is the last word line at step S2615. When the word line is not the last word line, the next common word line, for example, WL1 may be selected at step S2617, and steps S2603 to S2615 may be repeated. When it is determined that the read operation of the last word line, for example, WLn is completed at step S2615, the read operation may be completed.

Referring to FIGS. 24 and 27, a program loop to memory cells may be performed sequentially. When a program command, an address signal and data are input to perform a program loop, the first common word line WL0 may be selected in response to the address signal at step S2701. The LSB program operation to odd and even-numbered memory block layers of steps S2703 and S2705 and the MSB program operation to odd and even-numbered memory block layers of steps S2711 and S2713 may be performed in substantially the same manner as described with respect to steps S1905, S1907, S1913 and S1915 of FIG. 19. The LSB program verification operation to odd and even-numbered memory block layers of steps S2707 and S2709 may be performed.

An MSB program verify order of steps S2715 to S2725 may be performed in substantially the same manner as the MSB program verify order of steps S1917 to S1927 as described with respect to FIG. 19. However, the MSB program verify order of steps S2715 to S2725 may be different from the MSB program verify order of steps S1917 to S1927. When a program operation or a program verification operation is performed, word lines may be simultaneously selected from memory blocks of an odd-numbered layer or an even-numbered layer. That is, a program operation or a program verification operation may be performed when two memory strings, for example, ST0 and ST2 are simultaneously selected. The method of simultaneously selecting two word lines may be similar to the method described in connection with the read operation described with respect to FIG. 22.

At step S2727, it may be determined whether or not the selected word line is the last word line. When the word line is not the last word line, the next common word line, for example, WL1 may be selected at step S2729, and steps S2703 to S2727 may be repeated. At step S2727, when it is determined that the program loop of the last word line, for example, WLn is completed, the program loop may be completed.

Figure 28:
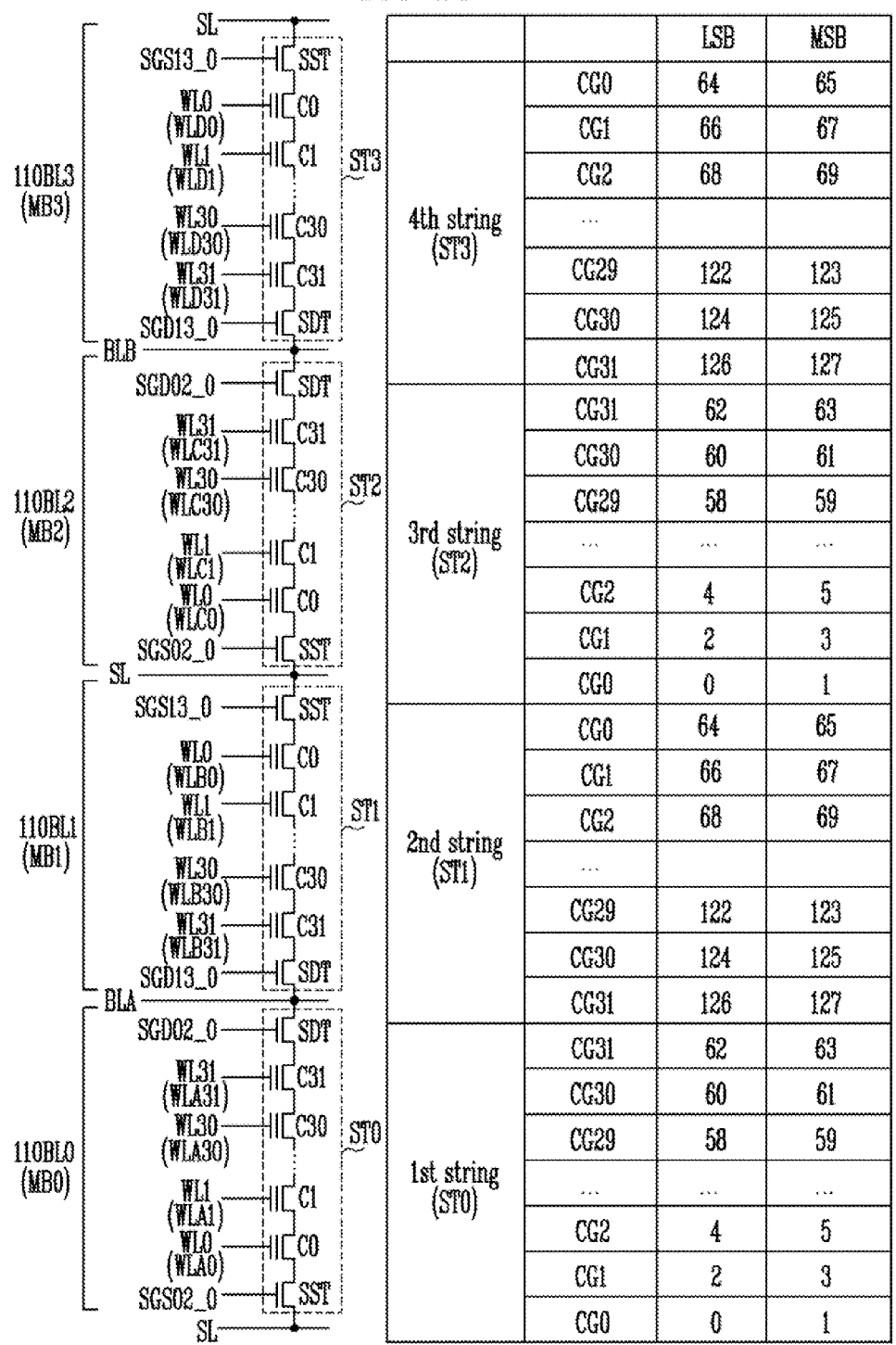
FIG. 28 is a view illustrating a method of operating a semiconductor memory device according to an embodiment of the present invention.

FIG. 28 is a view illustrating a method of operating a semiconductor memory device according to another embodiment of the present invention.

Figure 29:
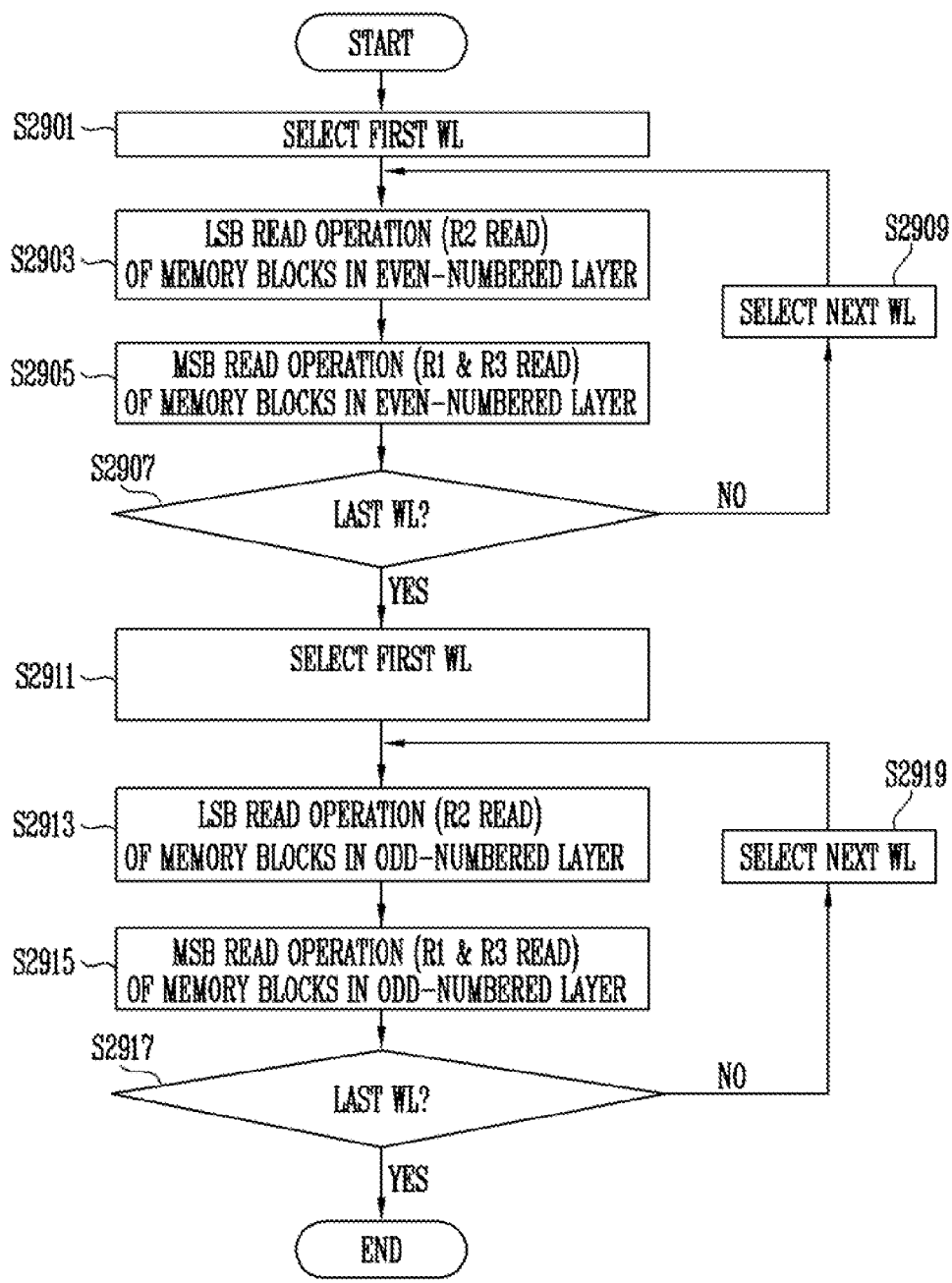
FIGS. 29 and 30 are flowcharts illustrating a method of operating a semiconductor memory device according to an embodiment of the present invention.
Figure 30:
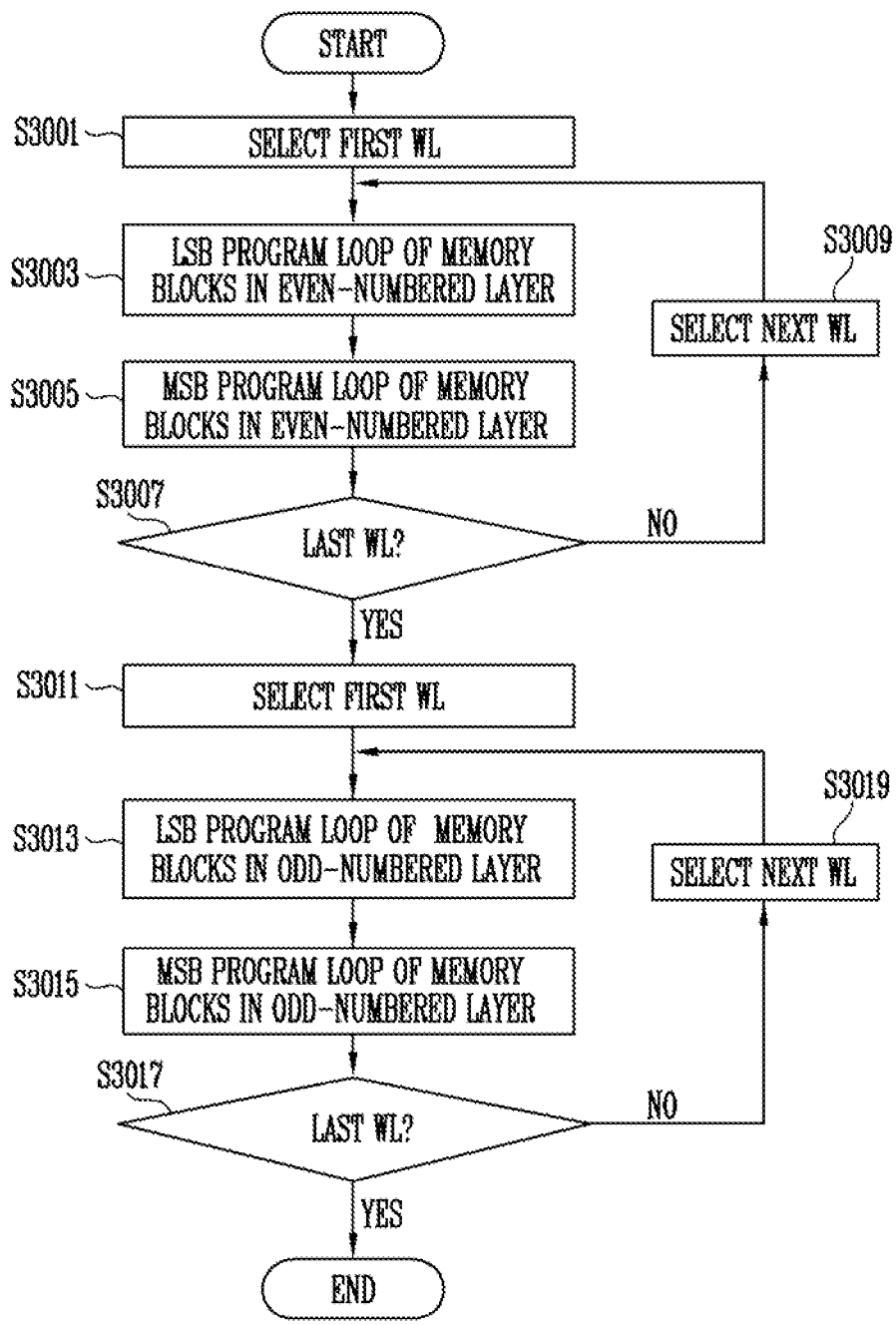

FIGS. 29 and 30 are flowcharts illustrating a method of operating a semiconductor memory device according to another embodiment of the present invention.

Referring to FIG. 28, as described with respect to FIG. 24, the selection lines SGD02_0 and SGS02_0 of the first and third memory blocks MB0 and MB2 may be coupled to each other, and the selection lines SGD13_0 and SGS13_0 of the second and fourth memory blocks MB1 and MB3 may be coupled to each other.

However, read/write circuit group 130 (not shown) may perform an LSB read operation or LSB program loop to memory cells coupled to word lines, for example, WL0 coupled to the second and fourth memory blocks MB1 and MB3 after an LSB read operation or an LSB program loop is performed to each of the memory cells coupled to the word lines WL0 to WLn of the first and third memory blocks MB0 and MB2.

As described above, when the LSB read operation and the MSB read operation are performed to the first and third memory blocks MB0 to MB3, the word lines WL0 to WLn may be selected sequentially. In substantially the same manner, when the LSB program loop and the MSB program loop are performed to the memory blocks MB0 to MB3, the word lines WL0 to WLn may be selected sequentially, which will be described below.

Referring to FIGS. 28 and 29, at step S2901, when a read command and an address signal are input in order to perform a read operation, the first common word line WL0 may be selected in order to perform the read operation to the memory blocks MB0 and MB2 in odd-numbered layer in response to the address signal.

An LSB read operation may be performed to the memory blocks MB0 and MB2 in the odd-numbered layer at step S2903. That is, the LSB read operation may be simultaneously performed to memory cells coupled to the first word lines WL0 of the first and third memory blocks MB0 and MB2 in response to the address signal. The LSB read operation may be performed by the method as described above with reference to step S2203 of FIG. 22.

An MSB read operation may be performed to the memory blocks MB0 and MB2 in the odd-numbered layer at step S2905. That is, the MSB read operation may be simultaneously performed to the memory cells coupled to the first word lines WL0 of the first and third memory blocks MB0 and MB2 in response to the address signal. The MSB read operation may be performed by the method as described above with reference to step S2205 of FIG. 22.

It may be determined whether the selected word line is the last word line at step S2907. When the selected word line is not the last word line, a next common word line, for example, WL1 may be selected at step S2909, and steps S2903 and S2907 may be repeated.

When it is determined that the read operation of the last word line, for example, WLn is completed at step S2907, the first common word line WL0 may be selected in order to perform the read operation to the memory blocks MB1 and MB3 in the even-number layer in response to the address signal at step S2911.

An LSB read operation may be performed to the memory blocks MB1 and MB3 in the even-number layer at step S2913. That is, the LSB read operation may be simultaneously performed to the memory cells coupled to the first word lines WL0 of the second and fourth memory blocks MB1 and MB3 in response to the address signal. The LSB read operation may be performed by the method as described above with respect to step S2207 of FIG. 22.

An MSB read operation may be performed to the memory blocks MB1 and MB3 in the even-number layer at step S2915. That is, an MSB read operation may be simultaneously performed to the memory cells coupled to the first word lines WL0 of the second and fourth memory blocks MB1 and MB3 in response to the address signal. The MSB read operation may be performed by the method as described above with respect to step S2209 of FIG. 22.

It may be determined whether the selected word line is the last word line at step S2917. If the selected word line is not the last word line, a next common word line, for example, WL1 may be selected at step S2919, and steps S2913 to S2917 may be repeated. When it is determined that the read operation of the last word line, for example, WLn is completed at step S2917, the read operation may be completed.

Referring to FIGS. 28 and 30, when a program command, an address signal and data are input to store data at step S3001, the first common word line WL0 may be selected in order to perform a program loop to the memory blocks MB0 and MB2 in the odd-numbered layer in response to the address signal.

An LSB program loop may be performed to the memory blocks MB0 and MB2 in the odd-numbered layer at step S3003. That is, the LSB program loop may be simultaneously performed to the memory cells coupled to the first word lines WL0 of the first and third memory blocks MB0 and MB2 in response to the address signal. The LSB program loop may include an LSB program operation and an LSB program verification operation. The LSB program operation may be performed by the method as described above with respect to step S2703 of FIG. 27. The LSB program verification operation may be performed by the method as described above with respect to step S2707 of FIG. 27.

The MSB program loop may be performed to the memory blocks MB0 and MB2 in the odd-numbered layer at step S3005. That is, the MSB program loop may be simultaneously performed to the memory cells coupled to the first word lines WL0 of the first and third memory blocks MB0 and MB2 in response to the address signal. The MSB program loop may include an MSB program operation and an MSB program verification operation. The MSB program operation may be performed by the method as described above with respect to step S2711 of FIG. 27. The MSB program verification operation may be performed by the method as described above with respect to steps S2715, S2719 and S2723 of FIG. 27.

It may be determined whether the selected word line is the last word line at step S3007. When the selected word line is not the last word line, a next common word line, for example, WL1 may be selected at step S3009, and steps S3003 to S3007 may be repeated.

When it is determined that the read operation of the last word line, for example, WLn is completed at step S3007, the first common word line WL0 may be selected in order to perform a program loop to the memory blocks MB1 and MB3 in the even-number layer in response to the address signal at step S3011.

A LSB program loop may be performed to the memory blocks MB1 and MB3 in the even-number layer at step S3013. That is, the LSB program loop may be simultaneously performed to the memory cells coupled to the first word lines WL0 of the second and fourth memory blocks MB1 and MB3 in response to the address signal. The LSB program loop may include an LSB program operation and an LSB program verification operation. The LSB program operation may be performed by the method as described above with respect to step S2705 of FIG. 27. The LSB program verification operation may be performed by the method as described above with respect to step S2709 of FIG. 27.

An MSB program loop may be performed to the memory blocks MB1 and MB3 in the even-numbered layers at step S3015. That is, the MSB program loop may be simultaneously performed to the memory cells coupled to the first word lines WL0 of the second and fourth memory blocks MB1 and MB3 in response to the address signal. The MSB program loop may include an MSB program operation and an MSB program verification operation. The MSB program operation may be performed by the method as described above with respect to step S2713 of FIG. 27. The MSB program verification operation may be performed by the method as described above with respect to steps S2717, S2721 and S2725 of FIG. 27.

It may be determined whether the selected word line is the last word line at step S3017. When it is determined that the selected word line is not the last word line, a next common word line, for example, WL1 may be selected at step S3019, and steps S3013 to S3017 may be repeated. When it is determined that a program loop of the last word line, for example, WLn at step S3017 is completed, the program loop may be completed.

According to the embodiments of the present invention, the coupling relationships of the local lines SGS02_0 and SGS13_0, WL0 to WLn and SGD02_0 and SGD13_0 of the memory blocks MB0 to MB3 and the word line selection order during the read operation and the program loop and voltage applying conditions of Table 1 as described above, a large number of memory cells may be formed within a predetermined area, and electrical characteristics may be improved.

Referring to the waveform diagrams of FIGS. 14A to 14C and 20A to 20E, the time required for the entire operation may be reduced by applying a precharge voltage and an operating voltage to another bit line and other local lines for the next read, program or program verification operation when or before voltages, which are applied to a bit line and local lines after the previous read, program or program verification operation, start to be discharged. That is, the time required for the entire operation may be reduced by overlapping the finish time of the previous operation and the start time of the next operation with each other by dividing bit lines into an upper bit line and a lower bit line and coupling a read/write circuit unit to the upper bit line and the lower bit line.

Figure 31:
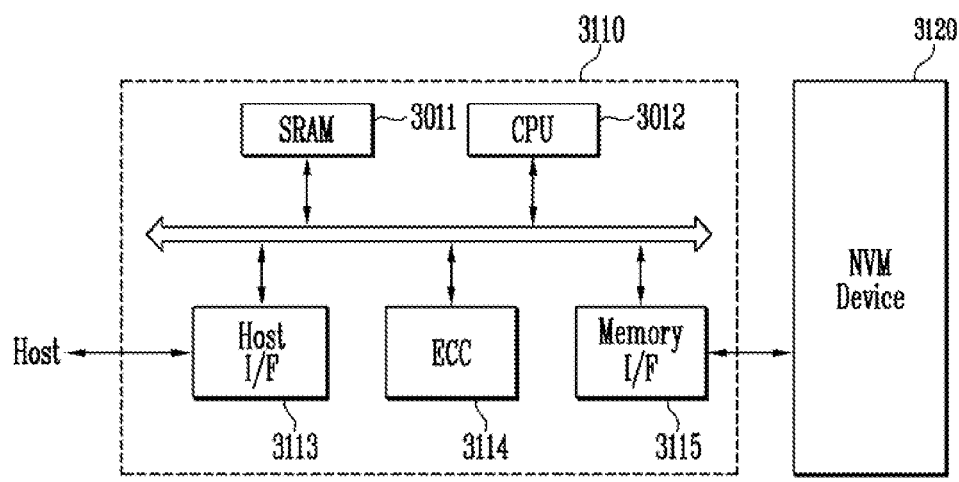
FIG. 31 is a block diagram illustrating a memory system according to an embodiment of the present invention.

FIG. 31 is a block diagram illustrating a memory system according to an embodiment of the present invention.

Referring to FIG. 31, a memory system 3100 according to an embodiment of the present invention may include a non-volatile memory device 3120 and a memory controller 3110.

The non-volatile memory device 3120 may be provided as the above-described semiconductor memory device. The memory controller 3110 may be suitable for controlling the non-volatile memory device 3120 in a general operation mode such as a program loop, a read operation or an erase loop.

The memory system 3100 may be a solid state disk (SSD) or a memory card in which the memory device 3120 and the memory controller 3110 are combined. An SRAM 3111 may function as an operation memory of a CPU 3112. The CPU 3112 may perform the general control operation for data exchange of the memory controller 3110. A host interface 3113 may include a data exchange protocol of a host being coupled to the memory system 3100. An ECC 3114 may detect and correct errors included in a data read from the non-volatile memory device 3120. A memory interface 3115 may interface with the non-volatile memory device 3120. The CPU 3112 may perform the general control operation for data exchange of the memory controller 3110.

Though not illustrated in FIG. 31, the memory system 3100 may further include ROM (not illustrated) that stores code data to interface with the host. The non-volatile memory device 3120 may be a multi-chip package composed of a plurality of flash memory chips. The memory system 3100 may be provided as a storage medium having high reliability and low error rate. A flash memory device according to an embodiment of the present invention may be provided in a memory system such as a semiconductor disk device (a solid state disk (SSD)) on which research has been actively conducted. For example, when the memory system 3100 is an SSD, the memory controller 3110 may communicate with an external device, for example, a host) through one of the interface protocols including USB, MMC, PCI-E, SATA, PATA, SCSI, ESDI and IDE.

Figure 32:
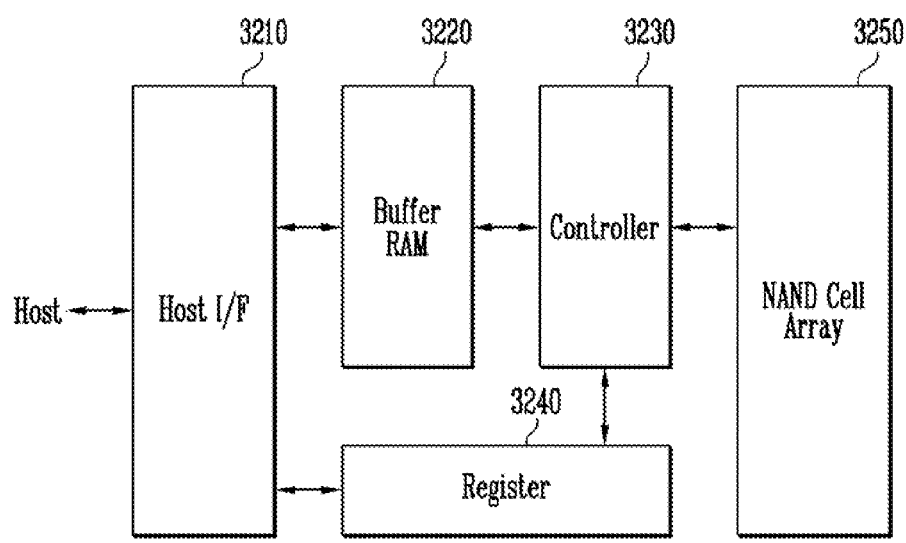
FIG. 32 is a block diagram illustrating a memory system performing a program operation according to an embodiment of the present invention.

FIG. 32 is a block diagram illustrating a memory system that performs a program operation according to an embodiment of the present invention. For example, technical features of the present invention may be applied to a OneNand flash memory device 1300 as the fusion memory device.

The OneNand flash memory device 3200 may include a host interface (I/F) 3210, a buffer RAM 3220, a controller 3230, a register 3240 and a NAND flash cell array 3250. The host interface 3210 may be configured to exchange various types of information with a device through a different protocol. The buffer RAM 3220 may have built-in codes for driving the memory device or temporarily store data. The controller 3230 may be configured to control read and program operations and every state in response to a control signal and a command that are externally given. The register 3240 may be configured to store data including instructions, addresses and configurations defining a system operating environment in the memory device. The NAND flash cell array 3250 may include operating circuits including non-volatile memory cells and page buffers. The memory array of FIG. 1 may be used as a memory array of the NAND flash cell array 3250.

Figure 33:
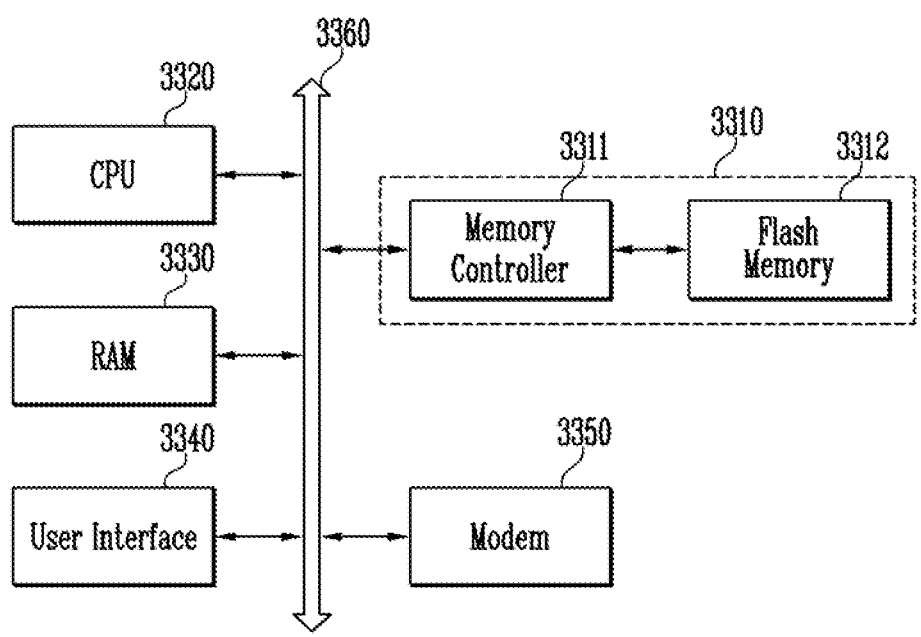
FIG. 33 is a block diagram illustrating a computing system including a flash memory device according to an embodiment of the present invention.

FIG. 33 is a block diagram illustrating a computing system including a flash memory device 3312 according to an embodiment of the present invention.

A computing system 3300 according to an embodiment of the present invention may include a microprocessor (CPU) 3320, RAM 3330, a user interface 3340, a modem 3350, such as a baseband chipset, and a memory system 3310 that are electrically coupled to a system bus 3360. In addition, if the computing system 3300 is a mobile device, then a battery (not Illustrated) may be provided to apply operating voltages to the computing system 3300. Though not shown in FIG. 33, the computing system 3300 may further include application chipsets, a Camera Image Processor (CIS), or mobile DRAM. The memory system 3310 may form a Solid State Drive/Disk (SSD) that uses a non-volatile memory to store data. The memory system 3310 may form a solid state drive/disk (SSD) using a non-volatile memory for storing data, or the memory system 3310 may be provided as a fusion flash memory, for example, OneNAND flash memory).

According to embodiments of the present invention, a large number of memory cells may be formed within a predetermined area, and electrical characteristics may be improved.

What is claimed is:

1. A semiconductor memory device, comprising:
a memory array including a first to a fourth memory blocks sequentially stacked over a substrate;
a first circuit suitable for performing a read operation and a program loop to memory cells included in the first or the second memory block; and
a second circuit suitable for performing the read operation and the program loop to memory cells included in the third or the fourth memory block,
wherein the first circuit is coupled to the first and the second memory blocks through lower bit lines,
wherein the second circuit is coupled to the third and the fourth memory blocks through upper bit lines,
wherein the first to fourth memory blocks share a common source line, and
the common source line is arranged in a direction crossing the lower bit lines and the upper bit lines.

2. The semiconductor memory device of claim 1, further comprising a voltage supply circuit suitable for applying operating voltages for the read operation and the program loop to word lines of the first to the fourth memory blocks.

3. The semiconductor memory device of claim 2, wherein the voltage supply circuit applies a first voltages to the word lines of the first to the fourth memory blocks and applies a second voltages to selection lines of the first to the fourth memory blocks.

4. The semiconductor memory device of claim 2, wherein the first circuit, the second circuit and the voltage supply circuit perform the read operation or the program loop while alternately selecting the word lines of the first memory block and the word lines of the third memory block and perform the read operation or the program loop while alternately selecting the word lines of the second memory block and the word lines of the fourth memory block.

5. The semiconductor memory device of claim 4, wherein the first circuit, the second circuit and the voltage supply circuit perform the read operation or the program loop to a selected word line in the first memory block and subsequently to a selected word line in the third memory block, and perform the read operation or the program loop on a selected word line in the second memory block and subsequently to a selected word line in the fourth memory block.

6. The semiconductor memory device of claim 4, wherein the first circuit, the second circuit and the voltage supply circuit perform LSB read operations or LSB program loops and subsequently MSB read operations or MSB program loops to selected word lines in each of the first and third memory blocks, and
perform LSB read operations or LSB program loops and subsequently MSB read operations or MSB program loops to selected word lines in each of the second and fourth memory blocks.

7. The semiconductor memory device of claim 2, wherein the voltage supply circuit applies a first voltages to the word lines of the first to fourth memory blocks, a second voltages to selection lines of the first and third memory blocks and a third voltages to selection lines of the second and fourth memory blocks.

8. The semiconductor memory device of claim 2, wherein the first circuit, the second circuit and the voltage supply circuit select the word lines simultaneously from the first and third memory blocks and simultaneously from the second and fourth memory blocks during the read operation and the program loop.

9. The semiconductor memory device of claim 2, wherein the first circuit, the second circuit and the voltage supply circuit alternately perform the read operation or the program loop on the word lines selected simultaneously from the first and third memory blocks and simultaneously from the second and fourth memory blocks.

10. The semiconductor memory device of claim 2, wherein the first circuit, the second circuit and the voltage supply circuit perform an LSB read operation and an MSB read operation or an LSB program loop and an MSB program loop to the word lines selected simultaneously from the first and third memory blocks and, subsequently, simultaneously from the second and fourth memory blocks.

11. The semiconductor memory device of claim 2, wherein the first circuit, the second circuit and the voltage supply circuit perform an LSB read operation or an LSB program loop and subsequently an MSB program loop or an MSB program loop to the word lines selected simultaneously from the first and third memory blocks and simultaneously from the second and fourth memory blocks.

* * * * *